US012224527B2

(12) United States Patent
Jiang

(10) Patent No.: US 12,224,527 B2
(45) Date of Patent: Feb. 11, 2025

(54) DEVICE FOR INSPECTING THE ASSEMBLY DEFECT OF A CONNECTOR CAPABLE OF FIXING THE POSITION OF A WIRE TERMINAL

(71) Applicant: SEWON ELECTRONICS CO., LTD., Pyeongtaek-si (KR)

(72) Inventor: Pengtao Jiang, Weihai (CN)

(73) Assignee: SEWON ELECTRONICS CO., LTD., Pyeongtaek-si (KR)

( * ) Notice: Subject to any disclaimer, the term of this patent is extended or adjusted under 35 U.S.C. 154(b) by 352 days.

(21) Appl. No.: 17/943,586

(22) Filed: Sep. 13, 2022

(65) Prior Publication Data

US 2023/0077378 A1 Mar. 16, 2023

(30) Foreign Application Priority Data

Sep. 13, 2021 (KR) .................. 10-2021-0122088

(51) Int. Cl.
*H01R 13/641* (2006.01)
*G01R 31/69* (2020.01)
(Continued)

(52) U.S. Cl.
CPC .......... *H01R 13/641* (2013.01); *G01R 31/69* (2020.01); *H01R 13/6275* (2013.01);
(Continued)

(58) Field of Classification Search
None
See application file for complete search history.

(56) References Cited

U.S. PATENT DOCUMENTS

| 4,902,968 | A | * | 2/1990 | Sugimoto | ............... | G01R 31/69 |
| | | | | | | 324/537 |
| 5,335,413 | A | * | 8/1994 | Yamamoto | ............. | H01R 43/22 |
| | | | | | | 324/756.02 |

(Continued)

FOREIGN PATENT DOCUMENTS

| JP | 2000-019214 A | 1/2000 |
| JP | 2020-119684 A | 8/2020 |

(Continued)

OTHER PUBLICATIONS

Korean Office Action issued on Dec. 27, 2021, in connection with the Korean Patent Application No. 10-2021-0122088.

(Continued)

*Primary Examiner* — Tho D Ta
(74) *Attorney, Agent, or Firm* — Hauptman Ham, LLP

(57) ABSTRACT

Disclosed is a device comprises: a moving block configured to have an inner space open toward one side, and to be capable of moving in forward direction toward a holder, formed on a connector jig, and in backward direction; a matching box, movably mounted in the moving block to be movable, of which shape is such that its movement in the forward direction is blocked by a part of a TPA connector seated in the holder if the part protrudes from the connector surface; and a contact switch configured to change its electrical state when the matching box moves, relative to the moving block, at a predetermined interval in the backward direction, wherein the moving block is configured to move further in the forward direction by at least the predetermined interval even in a state in which the matching box cannot move in the first direction.

18 Claims, 14 Drawing Sheets

(51) Int. Cl.
    *H01R 13/627*     (2006.01)
    *H01R 13/639*     (2006.01)
    *H01R 13/70*     (2006.01)
    *H01R 13/717*     (2006.01)

(52) U.S. Cl.
    CPC ........... H01R 13/639 (2013.01); H01R 13/70 (2013.01); H01R 13/7175 (2013.01); *H01R 2201/20* (2013.01)

(56) References Cited

U.S. PATENT DOCUMENTS

| | | | | |
|---|---|---|---|---|
| 5,614,820 A | * | 3/1997 | Aoyama | G01R 31/69 324/754.14 |
| 5,689,191 A | * | 11/1997 | Kashiyama | G01R 31/69 439/489 |
| 5,777,480 A | * | 7/1998 | Hatagishi | G01R 31/66 439/310 |

FOREIGN PATENT DOCUMENTS

| | | |
|---|---|---|
| KR | 10-2009-0041281 A | 4/2009 |
| KR | 10-1574053 B1 | 12/2015 |
| KR | 10-1601108 B1 | 3/2016 |

OTHER PUBLICATIONS

Korean Office Action issued on Apr. 15, 2022, in connection with the Korean Patent Application No. 10-2021-0122088.

* cited by examiner

DEVICE FOR INSPECTING THE ASSEMBLY DEFECT OF A CONNECTOR CAPABLE OF FIXING THE POSITION OF A WIRE TERMINAL

CROSS REFERENCE TO RELATED APPLICATION

This application claims the priority of Korean Application No. 10-2021-0122088, filed on Sep. 13, 2021. The entire disclosure of the above application is incorporated herein by reference.

BACKGROUND

Field

The present invention relates to a device for inspecting whether a connector combined, in order to easily connect electric wires with other electric wires, to the ends of electric wires is assembled in good condition or not.

Description of the Related Art

These days, many kinds of devices and appliances are used in daily life, work, leisure activities or medical practices etc. of people. Most of them perform the intended operations or functions based on electrical signal exchanges among their components. Particularly, a large-sized equipment, for example, a vehicle, a communication device, a medical device or the like connects many kinds of cables to each other among a large number of components to enable electrical communication therebetween.

At the ends of many kinds of cables, a connector, which is a wire-connecting terminal having a specific shape and structure, is combined in an electrically connected state for connection with other wires. The wires terminated with those connectors are electrically connected to the components on the board by being engaged with connectors, each of which has the corresponding shape and structure capable of male and female coupling, provided on the board or the like on which the components are mounted.

The connector used for easy connection between components as described above is composed of a receptacle housing, into which terminals crimped to the ends of the wires are inserted, a header to which the receptacle housing is inserted and coupled, and the like.

The header and the receptacle housing have a structure that can be coupled to each other, and generally, a locking member is formed on the outer surface to maintain their coupling state by elastic or frictional force after male and female coupling. Due to such a locking member, the connector with the header and the receptacle housing that are coupled to each other maintains the electrical circuit without being disengaging even in the case that a device to which the connector is applied for electrical connection is exposed to continuous vibration. This type of connector is commonly referred to as a Connector Position Assurance (CPA) connector.

However, in case of the CPA connector that is stably maintained by the member locking the connector mating, a contact failure would occur in its portion where the terminal of the electric wire inserted into the receptacle housing comes into contact with the metal part of the inner surface of the housing if irregular and high-intensity vibration is repeatedly applied to the connector.

Therefore, for a connector to be applied to equipment or a device operating in such a very unfavorable environment, a type of connector capable of stably maintaining the internal electrical contact despite an external influence is used. This type of connector is called a Terminal Position Assurance (TPA) connector. The TPA connector includes a separate component (referred to as a Terminal Fixture (FA), hereinafter) that secures the inserted position of the terminals inserted into each receiving hole of receptacle housing by fixing the terminals in that inserted position.

FIG. 1 illustrates a part of the components for the TPA connector, and shows a TF 12 having a long bar-shaped structure that is inserted (d1) from the side of a male-typed receptacle housing 11.

When the illustrated TF 12 is inserted and fixed from the side of the receptacle housing 11 in which the wires to each end of which the terminal 13 is crimp-coupled are respectively inserted into receiving holes, the stopping protrusions 121 formed, on the bar, corresponding to each position of the receiving holes block the rear wall 131 of the inserted terminal 13. Accordingly, each electric wire inserted into the receptacle housing 11 is fixed at its inserted position. In FIG. 1, the TF 12 is exemplified as an independent part separated from the receptacle housing 11, but it may be an accessory pre-assembled in the receptacle housing 11 in a partially slidable manner.

A worker who inspects whether the connector to which the cable is connected is normally assembled pushes (d1) the TF 12, as shown in FIG. 1, into the guide groove of the receptacle housing 11, into which each wire strand is inserted. Then, the TF 12 is fastened to the housing 11 while the hook 122 at the tip of the lower leg is caught at the step formed on the outer surface of the housing 11. Next, as shown in FIG. 2A, the receptacle housing 11 is inserted (d2) into the female-typed header 14 to form a complete connector, so that the wires connected to the receptacle housing 11 and the wires connected to the header 14 are easily electrically connected to each other.

Because the TF 12 fastened as described above fixes each terminal of the wire strands, which are inserted respectively into the receiving holes, at the inserted position, the combined connector ensures the state of electrical contacts therein even in devices that are subjected to highly vibrational environments.

However, there may be a case in which the TF 12 to be fastened to the receptacle housing 11 to secure the fixed position of terminal as described above is not completely fastened to the receptacle housing 11 due to a mistake or negligence of a worker who assembles connectors. FIG. 2B is an exemplified view of such a case, in which the TF 12 is not completely attached to the receptacle housing 11 by not sliding to the end of the guide groove formed in the receptacle housing 11 and partially (eg) not being inserted.

The female-typed header 14 and the male-typed receptacle housing 11 are generally combined to each other in a cabling work for the manufacture or production of equipment to which the TPA connector is applied, or an assembling work of a wiring harness component to be applied to equipment. Thus, if the receptacle housing 20 is not completely assembled as illustrated in FIG. 2B, a problem arises in those works. That is, because of the portion of the TF 12 that is partially protruded (eg) due to incomplete assembly, the receptacle housing 20 is not inserted into the header 14 of the corresponding female-typed structure.

As described above, since the assembling of the receptacle housing and the combination of the receptacle housing and the header are not performed by the same worker at the same place and time, even such a simple fastening defect of the TF 12 is difficult to solve immediately. If the above two types of works are performed by different manufacturers, the poor fastening could cause a bigger problem.

Therefore, the work of inspecting whether the TF of the receptacle housing for the TPA connector is completely fastened is required separately from the assembling work of the receptacle housing. In addition, rather than an inspection method in which a worker visually checks whether or not the TF protrudes partially from the receptacle housing, a method of mechanically checking whether or not the TF partially protrudes from the receptacle housing, using a separate inspecting tool could provide more accurate and quick inspection results.

SUMMARY OF THE INVENTION

An object of the present invention is to provide a device for inspecting the assembly defect of a TPA connector.

Another object of the present invention is to provide an inspection device capable of detecting a state in which a TF for fixing the position of an inserted terminal protrudes partially from a receptacle housing.

Another object of the present invention is to provide an inspection system capable of performing assembly defect for a large number of TPA connectors at once.

Another object of the present invention is to provide an inspection device capable of minimizing the impact applied to the inspection device or connector by preventing the inspection of one connector from being unnecessarily repeated in a batch inspection of a large number of TPA connectors.

The scope of the present invention is not necessarily limited to the above explicit statements. Rather, the scope of the present invention covers anything to accomplish effects that could be derived from the specific and illustrative explanations of the present invention below.

A device for checking whether a connector is fully assembled, according to an aspect of the present invention, comprises: a connector jig configured to have a holder which is a space open toward at least one side and an assembled connector is seated in; a moving block configured to have an inner space open toward one side, and to be capable of moving in a first direction toward the holder and in a second direction opposite to the first direction; a matching box, mounted in the moving block to be moved together with the moving block and to be also movable in the first direction and the second direction in the moving block, of which shape is such that its movement in the first direction is blocked by a part of the connector seated in the holder if the part protrudes from an outer surface of the connector; a driving unit configured to drive the movement of the moving block in the first and second directions; and a contact switch configured to change its electrical state when the matching box moves, relative to the moving block, at a predetermined interval in the second direction, wherein the moving block is configured to move further in the first direction by at least the predetermined interval even in a state in which the movement of the matching box in the first direction is blocked.

In an embodiment according to the present invention, a switch protruding upward by an elastic force is provided on a bottom surface of the holder, wherein the device is configured to supply power to the driving unit when the switch is pressed by a connector seated in the holder, and the driving unit moves the moving block in the first direction when power is supplied.

In an embodiment according to the present invention, the device further comprises a control unit configured to move the moving block in the second direction by controlling an operation of the driving unit when the electrical state of the contact switch changes to a specific state. In this embodiment, the controlling the operation of the driving unit may be cutting off a power supplied to the driving unit.

In an embodiment according to the present invention, the control unit maintains, even if the electrical state of the contact switch is changed back to a state before the specific state, a state in which the supply of the power to the driving unit is cut off for a predetermined time from the point in time when the electrical state is changed back.

In an embodiment according to the present invention, the device may comprise an off-delay unit configured to output a signal at a time delayed by a predetermined time from when the electrical state is changed back from the specific state to a state before the specific state.

In an embodiment according to the present invention, the control unit may turn on an LED light when the electrical state of the contact switch changes to the specific state, and the LED light may be mounted on the top of the moving block.

In an embodiment according to the present invention, the driving unit may be a pneumatic cylinder operated by a pressurized air supplied as power, and the controlling the operation of the driving unit may be driving a solenoid valve, which is connected to a pipe for supplying the pressurized air to the pneumatic cylinder, to discharge the pressurized air in the pipe.

In an embodiment according to the present invention, the device may, further comprise a connector lock, coupled to the side of the holder's entrance, that is equipped with a latch capable of fixing a connector to a seated position in the holder by partially blocking one side of the seated connector to prevent the seated connector from coming off the holder by the elastic force of the switch. And, the connector lock may comprise: a rotatable latch member configured to accommodate the latch for hooking one end of the seated connector and to rotate together with a shaft when rotating about the shaft; an elastic member, connected to the shaft, configured to accumulate a rotational elastic force as the shaft rotates; and a button installed on a side, toward which the latch member rotates, to be movable in a direction perpendicular to a plane on which the latch member rotates. A locking protrusion may be formed on one surface of the button in order to block a portion of one side wall of the latch member when the latch member is rotated at a predetermined angle, thereby preventing the latch member from returning to a state before rotation due to the rotational elastic force of the elastic member.

In an embodiment in which the connector lock is provided in the device, a pole is installed on a surface of the moving block facing the first direction in order to release a locking state of the seated connector made by the latch by pushing the latch at its tip end when the moving block moves in the first direction.

In an embodiment according to the present invention, the matching box is configured to include at least one surface that passes close, within a predetermined gap, to the specific surface of the connector seated in the holder as the moving block moves in the first direction.

In another embodiment according to the present invention, the matching box may include a plate configured to have one surface disposed parallel to the specific surface of the connector seated in the holder. The plate, which is positioned at a front in the first direction in the matching box, approaches the specific surface as the moving block moves in the first direction, In an embodiment according to the present invention, the matching box is configured such that a distance from the one surface to a surface to which one end of the contact switch is fixedly coupled is adjustable.

In an embodiment according to the present invention, the connector jig is configured to be able to adjust a position, based on the open one side, for seating a connector in the holder through attachment/detachment of at least one plate-shaped member.

In an embodiment according to the present invention, an elastic member, capable of contracting or extending along a direction in which the moving block moves, is inserted between a first surface, among inner surfaces of the moving block, perpendicular to the first direction, and a second surface of the matching box opposite to the first surface, wherein one end of the contact switch is fixed to the first surface, the other end of the contact switch is fixed to the second surface, and at least one end of both ends of the switch protrudes from the surface to which it is fixed, and the elastic member has a length such that when no force is applied to the matching box, the both ends are spaced apart by the predetermined interval or less.

The apparatus for collectively inspecting each assembled state for a plurality of connectors according to another aspect of the present invention, may be configured to include a plurality of the above devices, and it may comprise a control unit configured to move the moving block included in an arbitrary device in a direction away from the connector jig included in the arbitrary device by controlling an operation of the driving unit included in the arbitrary device when the electrical state of the contact switch included in the arbitrary device changes to a specific state.

The present invention described above or a connector inspection device configured in accordance with at least one embodiment of the present invention to be described in detail below with reference to appended drawings is capable of detecting poorly-assembled connectors, one by one, in which the TF for fixing the positions of inserted wire terminals within the connector is not completely fastened, and of completing the assembly suitability inspection for a plurality of connectors at once as well. Productivity would be increased by such a quick assembly defect inspection for the TPA connectors.

In addition, the inspection system configured according to the present invention removes a poorly-assembled TPA connector from one inspection device, without a worker's manual manipulation for the opening/closing of pressurized air to be used to drive the inspection devices, and visually distinguishes that one inspection device from other devices, so that a worker can immediately recognize which connector of the inspection device is defective in assembly among the connectors that are collectively inspected, and deal with that connector quickly. This also helps to shorten the time required for inspection of the TPA connectors.

In one embodiment of the present invention, the restoration to the inspection ready state of the inspection device that has detected the assembly defect is delayed. Due to such a delay, the possibility that a worker, who mistakenly recognizes that the automatic connector removal due to detection of poor assembly by inspection device is caused from wrong seating the connector in inspection position, will restart the inspection device is eliminated. During this time delay after removal of the connector, even if a worker drives the inspection device while adjusting the seating position of the connector, actual driving for the inspection device does not occur. As a result, even if a worker misrecognizes the automatic removal of the connector, the possibility that a moving member of the inspection device repeatedly collides with the connector is eliminated, so that the fatigue of the driving mechanism of the inspection device due to collisions occurring during inspection could be minimized, and unnecessary delays in the time required for inspection of connectors could be also prevented.

In addition, in some embodiments according to the present invention, for various types of connectors, it is possible to match the difference in the approach distance to the connector required to determine whether or not the assembly of the TF is in good condition, and the connector seating position can be adjusted to suit the inspection to each type of connector. If those embodiments are applied, various types of connectors can be inspected without errors in determination of assembly suitability/unsuitability.

DETAILED DESCRIPTION

Figure 1:
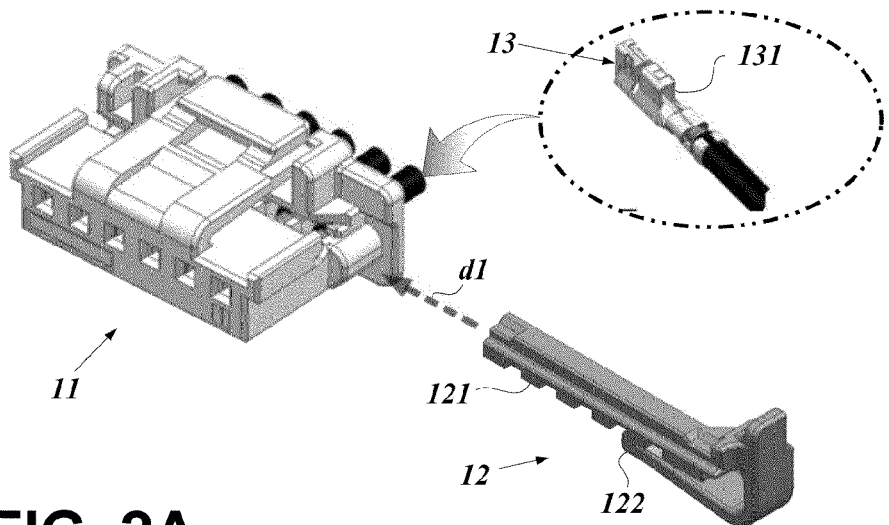
FIG. 1 illustrates a part of the components for a TPA connector.
Figure 2A:
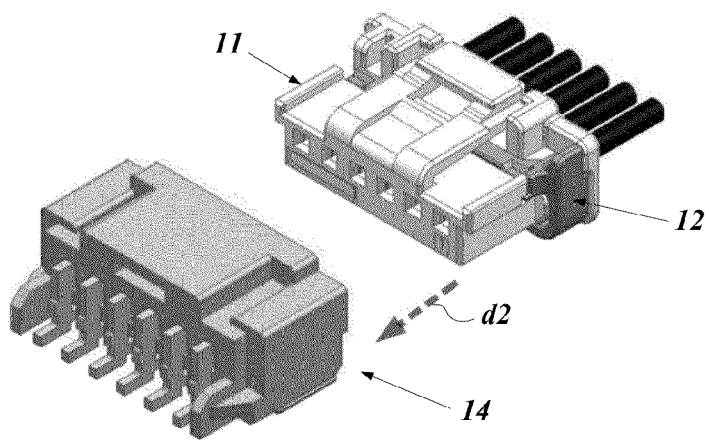
FIGS. 2A and 2B illustrate the assembled states of a TF fastened to fix the positions of wire terminals to the TPA connector.
Figure 2B:
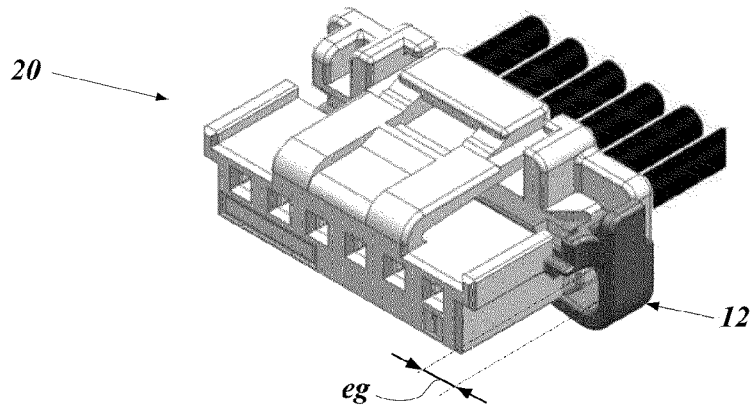

In what follows, embodiments of the present invention will be described in detail with reference to appended drawings.

In the following description of the embodiments of the present invention and the accompanying drawings, the same reference numerals or symbols designate the same elements unless otherwise specified. Of course, for convenience of explanation and for the sake of understanding, the same components may be indicated by different reference numbers or symbols if necessary.

Figure 3A:
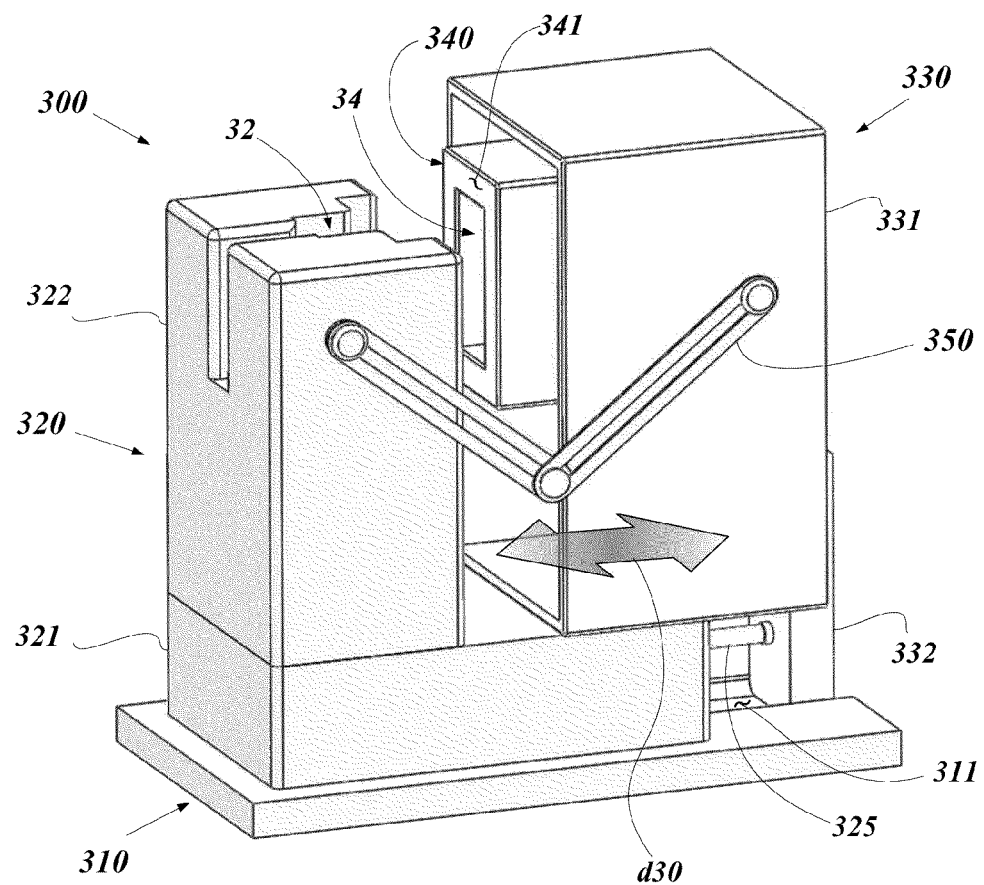
FIG. 3A is a perspective view showing the appearance of an inspection device according to an embodiment of the present invention.
Figure 3B:
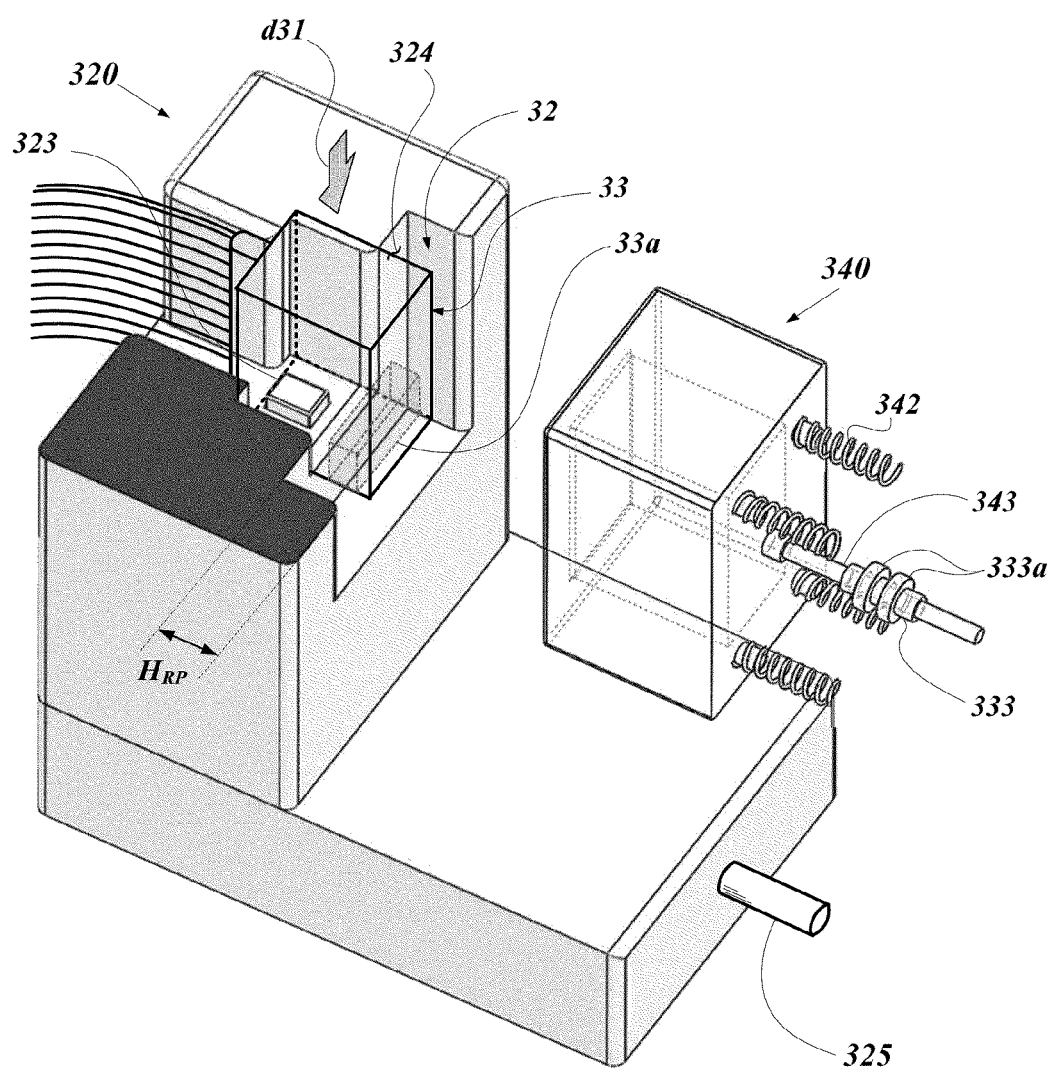
FIG. 3B is a perspective view showing only a part of the structure of the inspection device of FIG. 3A, partially cut out so that the inner structure can be seen.

FIG. 3 is an example of the configuration of a Connector Assembly Inspection Device 300 (CAID) for inspecting whether a TPA connector is assembled completely, according to an embodiment of the present invention. FIG. 3A is a perspective view showing the exterior of the CAID, and FIG. 3B is a perspective view showing a part of its structure by partially incision so that the inner structure can be seen.

The CAID 300 comprises: a base table 310; a test body 320, fixedly mounted on the base table 310, that has a space 32 formed thereon for seating a TPA connector to be inspected; a carrier 330, whose an internal space is opened toward the test body 320, installed so as to move forward and backward in the direction toward the test body 320; a matching box 340 installed to be movable in the inner space of the carrier 330; and a pair of articulated guide links 350 that connect between the carrier 330 and the test body 320 so as to maintain a moving path when the carrier 330 reciprocates with respect to the test body 320.

Prior to a detailed description of the embodiments of the present invention, terms for directions to be used in the present specification are defined as follows.

In the configuration shown FIG. 3A according to an embodiment of the present invention, the carrier 330 advances to the test body 320 and then moves backward (d30), in order to inspect whether the assembly of the TPA connector is complete. The forward direction to advance to the test body 320 is designated as 'front' of the carrier 330 (the matching box 340 moving together), and the backward direction is designated as 'rear' thereof. In the case of the test body 320, the direction facing the carrier 330 is designated as 'front', and the opposite direction is designated as 'rear'.

Terms for other directions, including upper/top and lower/bottom, unless otherwise specified, indicate directions based on the top and bottom of the illustrated drawings, or directions that can be intuitively recognized from the drawings.

The test body 320 includes a driving box 321 in which a pneumatic cylinder for driving the forward/backward movement of the carrier 330 is installed as a driving means, and a connector jig 322 on which a structure 32 (referred to as a 'holder' for this structure) shaped to seat a TPA connector to be inspected is formed.

The holder 32 formed on the upper part of the connector jig 322 is, as illustrated in FIG. 3B, opened upward and has a structure penetrating to the rear side while being stepped from the front side. The holder 32 is also formed with a dimension that allows the front surface of the TPA connector 33 to protrude further than the riser 324, which is referred to as ICS (Innermost Contact Surface) hereinafter, of the first step by a predetermined interval when a TPA connector 33 is inserted and mounted from the top of the holder 32 downward (d31) with its rear side in contact with the riser of the second step. Preferably, the second step is made at a point to ensure that the front surface of a seated TPA connector 33 is protrude a little more than the height Hi of the front surface of the connector jig 322 from the ICS 324.

A switch 323 is provided on the bottom surface of the holder 32 to slightly protrude from the bottom surface. The switch 323 moves up and down depending on whether a pressing force is applied, and functions to open and close a valve of the supply pipe connected to the pneumatic cylinder provided in the driving box 321.

The pneumatic cylinder in the driving box 321 is operated by a pressurized air supplied from the outside. When the switch 323 is pressed, the piston of the pneumatic cylinder is driven while the pressurized air is supplied, thereby reversing (namely, pulling towards the driving box 321) the rod 325 protruding to the outside of the driving box 321. When the pressure by the pressurized air applied to the piston is relieved, the pneumatic cylinder advances the rod 325 by the elastic force accumulated in the internal elastic member.

The carrier 330 comprises a support 332 connected to the rod 325 and reciprocating along a guide groove 311 formed on the upper surface of the base table 310 depending on the forward and backward movement of the rod 325, and a moving block 331, fixedly combined to the support 332, that has the matching box 340 mounted therein in a movable state.

Due to the above configuration of the carrier 330, when the pneumatic cylinder in the driving box 321 is operated, the moving block 331 moves back and forth, and the matching box 340 mounted therein is brought closer to or away from the test body 320.

FIG. 3B shows an example in which the matching box 340 is mounted in a movable state within the moving block 331.

The matching box 340 is mounted in the moving block 331 with a long slide rod 343, fixedly coupled to the rear surface thereof, being inserted into the pipe-shaped coupling tube 333 of a predetermined length. The coupling tube 333 is inserted into a through hole of the rear wall of the moving block 331 and its pair of plates 333a are fastened to each other with the rear wall interposed therebetween, whereby the coupling tube 333 is fixedly combined to the moving block 331. Accordingly, the matching box 340 is capable of sliding with respect to the coupling tube 333 in tube's longitudinal direction via the slide rod 343 while being mounted in the moving block 331.

On the slide rod 343 and the coupling tube 333, rails structured to engage in a concave-convex shape so that the slide rod 343 does not rotate are formed in each longitudinal direction.

On the rear surface of the matching box 340, a plurality of springs 342 are fixed, as an elastic member having an elastic force, at the corresponding positions in such a way that the provided protrusions are inserted into one end of each spring. Each spring 342 has a length, under the condition that no force is applied, such that the other end contacts its fixing point at the inner wall of the moving block 331 when the front side of the matching box 340 protrudes more than a predetermined distance from the front side of the moving block 331.

Figure 4:
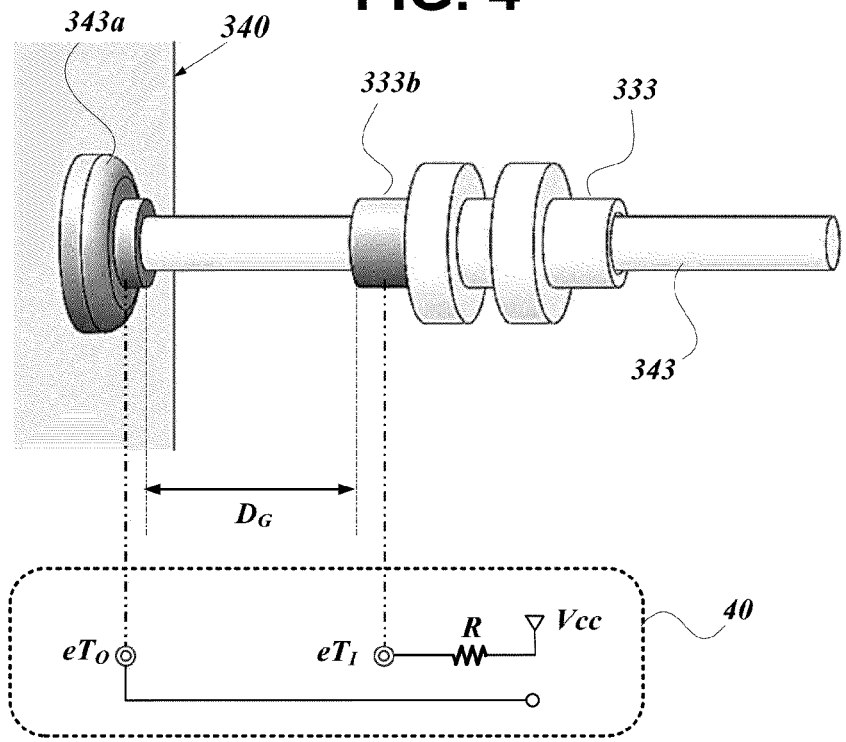
FIG. 4 is a view partially showing the coupling relationship to the rear side of the matching box of an inspection device, together with the electrically-connected relationship, according to an embodiment of the present invention.

A bracket 343a fixed to the rear surface of the matching box 340 is screwedly coupled to the slide rod 343. In the case of bracket 343a, it is made of a conductive metal material, or a conductive coupling part is fastened to or a conductive thin film is provided on at least the surface of the end (the surface facing the coupling tube 333). In addition, in the coupling tube 333, at least the portion 333b toward the matching box 340 is also made of a conductive metal material. As illustrated in FIG. 4, these conductive both sides 343a and 333b are respectively connected via appropriate wiring to both ends of a circuit block through which current can flow therebetween when physically in contact with each other. The circuit block is configured within a multi-channel inspection system to be described later. The conductive both sides 343a and 333b electrically connected in this way constitute a contact switch.

At least one of the bracket 343a and the coupling tube 333 is fastened to the corresponding coupling target, that is, the matching box 340 or the moving block 331 through a cushioning elastic member that can be compressed to some extent when an external force is applied along the moving direction of the carrier 330. This cushioning elastic member absorbs some of the external force that is applied when the bracket 343a and the coupling tube 333 collide with each other and is sustained thereafter in the connector inspection, which will be described later, and at the same time, it stably holds the electrical contact between the bracket 343a and the coupling tube 333.

The coupling tube 333 is fixedly installed in a through hole of the rear wall of the moving block 331, and the slide rod 343 can freely move in the inner pipe-shaped space of the coupling tube 333, as described above. Because each of the springs 342 having one end attached to the matching box 340 is installed with the other end fixed to the inner wall of the moving block 331, the matching box 340 moves with the moving block 331 when the moving block 331 moves, in a state in which no force is applied to the matching box 340.

The matching box 340 is installed within the moving block 331 through assembly of related accessories so that the depth HRP of the ICS 324 is, in a state where no force is applied to the spring 342, not shorter than a gap DG (this gap is referred to as 'reference interval' hereinafter.) between one end of the bracket 343a and one side of the coupling tube 333 that is surface-corresponding to the one end.

In addition, it is preferable that the matching box 340 is installed within the moving block 331 so that the distance at which its front surface protrudes from the front surface of the moving block 331 is equal to the reference interval $D_G$.

In another embodiment according to the present invention, the above-mentioned holder 32 may form only a single step for accommodating a TPA connector without forming the ICS 324. In the present embodiment, the structure of the holder may be formed in a dimension such that the front surface of a TPA connector inserted to be seated downward from the top (d31) protrudes further by the reference interval $D_G$ than the front surface of the connector jig 322.

If a position at which the moving block 331 moves forward, that is, toward the test body 320 side, to the maximum, is spaced apart from the front surface of the connector jig 322 by a predetermined distance, the holder may be formed with a structure and dimensions that allow a TPA connector to protrude further at least by the spaced distance.

The matching box 340 installed to be movable within the moving block 331 has a rectangular-shaped structure in which a matching pocket 34 with an open front is formed. The matching pocket 34 is a space in which a TPA connector to be inspected for assembly defects can be inserted and accommodated internally. The space is made with the same dimension, within an appropriate tolerance range, as the outer dimension of a TPA connector to be inspected.

In addition, the matching box 340 has a size such that the width of the front square edge 341 made by the formation of the matching pocket 34 is not wider than the width of the ICS 324.

Due to such a structure and dimensions of the matching box 340, when the matching box 340 is advanced toward the connector jig 322 by the moving block 331 in a state in which a TPA connector to be inspected is inserted into the connector jig 322, the TPA connector seated in the holder enters the matching pocket 34, and at the same time, the square edge 341 enters between the rectangular canal that is a space formed by the outer surface of the TPA connector, the riser and the tread of the first step formed in the connector jig 322. At this time, it is preferable to make a gap between the inner edge of the matching pocket 34 and the surface of a seated TPA connector as short as possible. Thus, the matching box 340 is configured in a size and shape such that the gap with the outer surface (This is specifically referred to as an 'inspection surface' hereinafter, if necessary) of a TPA connector, which is seated to be inspected whether the assembly of the connector accessory, namely TF is defective, is within 1 to 2 mm, for example.

The operation in which the CAID 300 configured as described above detects the TPA connector of which TF is not completely assembled will be described in detail below.

A worker inserts a TF-assembled TPA connector into the holder 32 from the top to the bottom (d31) of the connector jig 322, as illustrated in FIG. 3B, to seat it on the bottom surface of the holder, and then holds it pressed for a while.

Figure 5A:
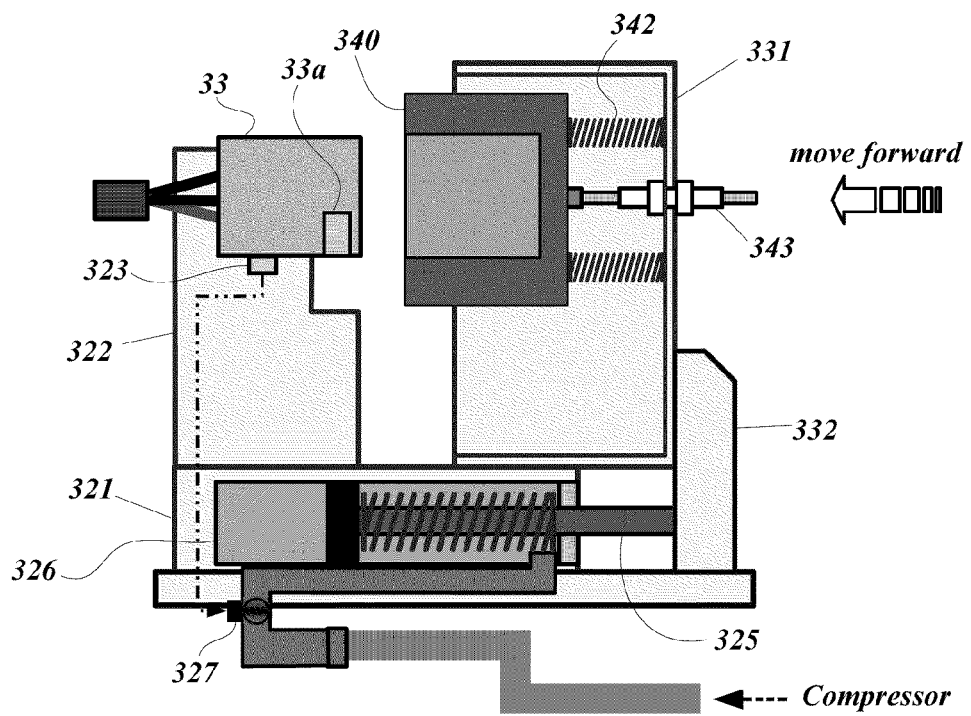
FIGS. 5A and 5B are diagrams illustrating an operation mechanism of an inspection device according to an embodiment of the present invention by conceptually simplifying the configurations.
Figure 5B:
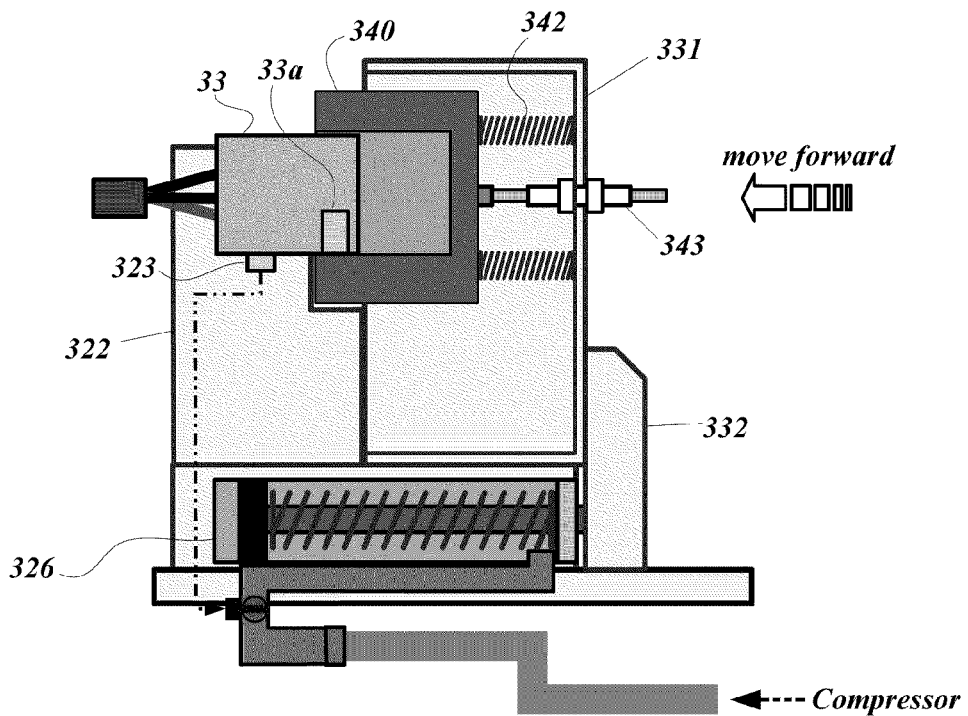

FIGS. 5A and 5B are conceptually simplified diagrams of related components to facilitate understanding of the operation of the CAID 300 while a worker is pressing a TPA connector 33 seated in the holder 32.

While the TPA connector 33 is pressed, the switch 323 installed on the bottom of the holder 32 is also in the pressed state. Thus, a valve 327 installed in a supply pipe of a pressurized air is maintained in a rotated open state. In the open state of the valve 327, a pressurized air supplied from an air compressor flows into the pneumatic cylinder 326 installed in the driving box 321 to operate the cylinder.

At this time, as shown in FIG. 5A, a pressurized air pushes the piston of the pneumatic cylinder 326, and the rod 325 is pulled backwards, whereby the moving block 331 advances to the test body 320 together with the matching box 340 installed inside. The pneumatic cylinder 326 installed in the driving box 321 has a piston stroke such that the front side of the moving block 331 advancing to the connector jig 322 is in contact with the connector jig 322, or is positioned at a point right before the connector jig 322.

Accordingly, while a worker presses the TPA connector 33 to be inspected in the holder 32, the moving block 331 abuts or comes closest to the front surface of the connector jig 322, so that the outer edge 341 of the matching box 340 carried by the moving block 331 enters the square kernel formed between the TPA connector 33 and the first step of the holder 32, and at the same time, the TPA connector 33 fixed in the holder 32 is inserted into the matching pocket 34.

FIG. 5B is a view illustrating, in the same manner as in FIG. 5A, a state in which the moving block 331 is moved to the maximum by the pneumatic cylinder 326, in the case that the TPA connector placed for inspection placed on the connector jig 322 is a fully-assembled one of which the TF 33a is completely pushed into the receptacle housing without any remaining portions protruding from the housing surface, i.e., the inspection surface. As described above, the fully-inserted TF 33a fixes the terminals of the electric wires inserted respectively into the receptacles inside the receptacle housing, so that the intended function of the TPA connector is guaranteed.

Even if a worker releases the force pressing the normal TPA connector 33 seated in the holder 32 while the TPA connector 33 to which the TF 33a is completely fastened is inserted into the matching pocket 34 of the matching box 340, the CAID 300 maintains the state of FIG. 5B. Because a pressurized air is applying pressure to the piston of the pneumatic cylinder 326, and thus the moving block 331 continues to apply a force toward the connector jig 322, the seated TPA connector 33 is not pushed upward and maintains its state (This state is referred to as a 'Locked State' (LS).) even if a repulsive force of the pressed switch 323 acts on the seated TPA connector 33.

The LS of the CAID 300 may be made in a state in which the springs 342 provided on the rear of the matching box 340 are somewhat compressed if the front edge 341 of the matching box 340 comes into contact with the ICS 324 just before the matching box 340 moves by the piston stroke of the pneumatic cylinder 326.

On the other hand, in a production site where many TPA connectors must be inspected, a plurality of the above-described CAIDs, pipes that supply pressurized air to them respectively, cables connected to transmit electrical signals necessary to detect or display the state of each CAID, and a circuit block configured to transceive the electrical signals or control the CAIDs individually are provided, and are then integrated to form an inspection machine capable of collectively inspecting a plurality of TPA connectors.

Such an integrated inspection machine is called a 'Multi-channel Inspection System' (MIS). In the present specification, the term 'channel' is used to include all of the CAID 300, which inspects the assembly suitability of a TPA connector as described above, and ancillary equipment and/or circuits connected for the operation of the CAID.

A worker in charge of inspecting whether the assembly of the TPA connector is complete using the MIS, when the state of a CAID of any one channel becomes the LS as illustrated in FIG. 5B, moves to a CAID of another channel and performs the same operation as described above for another TPA connector.

In a state where a plurality of TPA connectors to be inspected are seated in the individual CAID, a worker checks whether there is any defective connector whose TF is not fully assembled among the TPA connectors currently seated in the CAID of each channel, by checking the information, displayed by the circuit block, to indicate the inspection result of each CAID.

Figure 6:
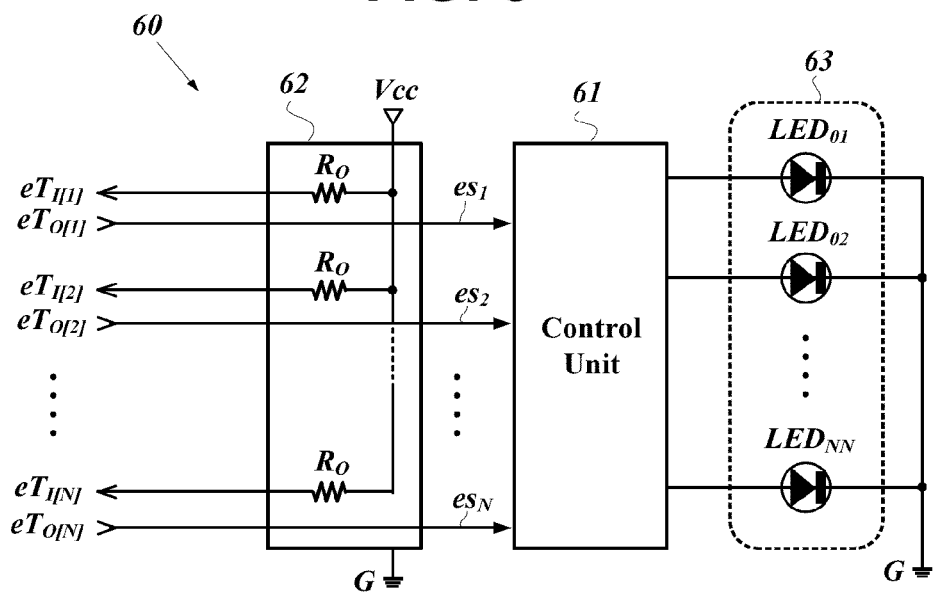
FIG. 6 is a block diagram of a circuit block provided in a multi-channel inspection system including a plurality of inspection devices according to an embodiment of the present invention.

FIG. 6 is a block diagram showing an example of the configuration of the circuit block 60. As illustrated, the circuit block 60 of FIG. 6 comprises: a signal supply unit 62 for providing an electrical signal whose value is changed depending on the operating state of the CAID 300 of each channel; identification LEDs 63 provided corresponding to the number of CAIDs; and a control unit 61 that individually drives the identification LEDs 63 to be turned on depending on a signal output from the signal supply unit 62.

The signal supply unit 62 constitutes a circuit such that a pair of wires is extended for each CAID and respectively connected to a terminal eTo on the side of the conductive bracket 343a of that CAID and another terminal eTI on the side of the coupling tube 333, which have been described with reference to FIG. 4. Due to such wire connection and circuit configuration, the electrical state $es_i$ (i=1, 2, ..., N) of the wire connected to the terminal $eT_O$ (This may be the terminal $eT_I$ on the side of the coupling tube, depending on the wire connecting or circuit configuring method.) on the side of the bracket 343a changes in one CAID when the bracket 343a and the coupling tube 333 of that one CAID come into contact with each other. In the configuration illustrated in the figure, the terminal $eT_O$ is changed from a floating state to a current-outputting state.

When any one of the applied signals $es_i$ (i=1, 2, ..., N) changes in the electrical state, the control unit 61 drives the identification LED, which is connected to correspond to that one signal line in the circuit configuration, to light it. In this embodiment, the control unit 61 may consist of current amplifiers of which each amplifies the applied signal $es_i$ (hereinafter, referred to as a 'locking signal') and applies it to the identification LED.

In the description of the above-described embodiment, if the plurality of CAIDs all maintain LS as illustrated in FIG. 5B for their seated TPA connectors, the contact state between the bracket and the coupling tube of each CAID is not made. Since all signals output from the signal supply unit 62 are in an open state, none of the identification LEDs 63 are lit. All turned=off identification LEDs 63 informs that the TPA connectors locked in each CAID are fully-assembled ones with all the attached TF fastened completely.

Confirming the inspection result through the identification LEDs, a worker operates a main valve installed in a main pipe, which is a supply pipe before branching to the supply pipes connected respectively to the CAIDs, so that a pressurized air is discharged from all the supply pipes at the same time as a pressurized air from the air compressor is cut off. Since the air pressure in each supply pipe is released, the force applied to the piston of the pneumatic cylinder 326 of each CAID is removed, and the restoring force of the spring in the pneumatic cylinder acts, whereby the rod 325 is advanced to its original position. Accordingly, the moving block 331 returns to an original pre-inspection position as the LS is released in each CAID.

When the LS is released, the pressed switch 323 under the seated connector is momentarily lifted by the accumulated elastic force and pushes the seated connector upward.

Figure 7:
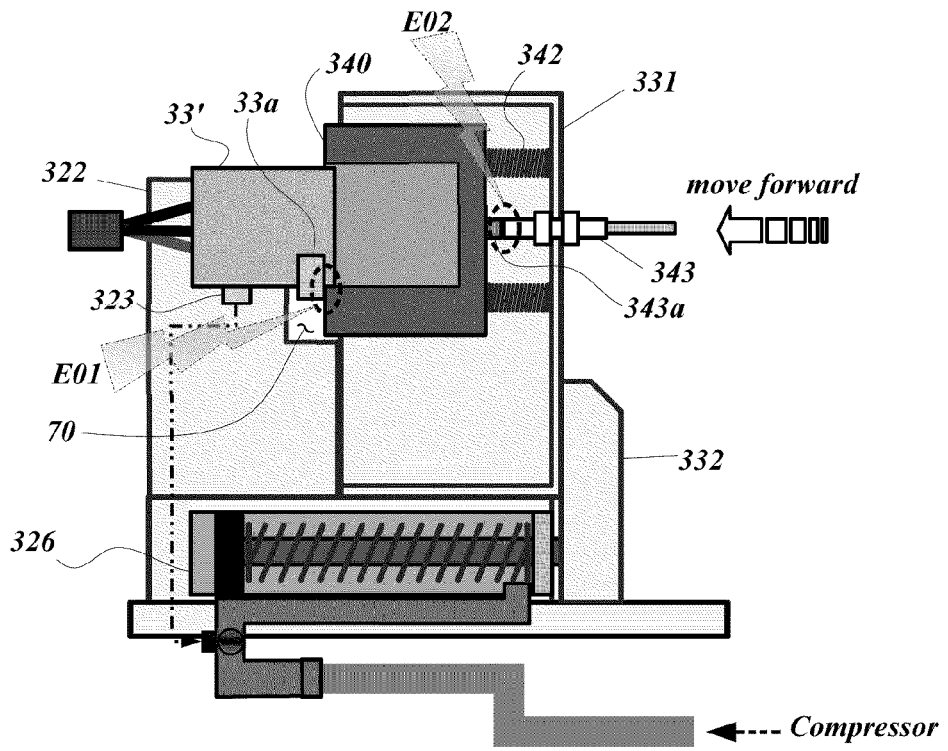
FIG. 7 is an example of an incomplete locking state made in the inspection of the connector due to a defectively-assembled TF in an inspection device according to an embodiment of the present invention.

In the above batch inspection method for a plurality of TPA connectors using the MIS composed of the CAID 300 of each channel and a circuit block, etc., if a TPA connector with its TF assembled incompletely is seated in the holder of any one of the CAIDs, an incompletely-locked state (hereinafter, referred to as a 'Semi-Locked State' (SLS)) is made as illustrated in FIG. 7.

In the case that a TF 33a is not fully fastened and partially protrudes from the inspection surface of a TPA connector 33', the square edge 341 of the matching box 340 is caught by the TF 33a (E01) protruding near the entrance of the square kernel 70, which is made between the seated connector 33' and the connector jig 322, while the moving block 331 is advancing to the connector jig 322, so that the matching box 340 is not fully inserted into the square kernel 70.

Even at this time, since the pneumatic cylinder 326 does not move the rod 325 as much as its stroke, the force of the pneumatic cylinder 326 that is moving the rod 325 backward continuously pushes the carrier 330 in the moving direction. From this time on, as the springs 342 between the rear surface of the matching box 340 and the inner wall of the moving block 331 are compressed, the stopped matching box 340 moves in the reverse direction relative to the moving block 331 being still moved. Due to this relative movement of the matching box 340, the rear bracket 343a and the coupling tube 333 fixed to the moving block 331 come close to each other, and they are finally brought into physical contact with each other (E02) at least before the pneumatic cylinder 326 is actuated by its stroke.

When one pair of both terminals $eT_{I[k]}$ and $eT_{O[k]}$ described above are short-circuited with each other due to the physical contact between the bracket 343a and the coupling tube 333, the state of the locking signal $es_k$ applied to the control unit 61 becomes different from other applied locking signals, the control unit 61 detecting the differentiated locking signal drives one identification LED, which corresponds to the wire from which the differentiated locking signal is inputted, to be turned on.

If one or more of the identification LEDs are lit in this way, a worker checks the CAID of the channel corresponding to the lit identification LED, and treats a TPA connector inspected by that CAID as defectively-assembled one.

If the identification LEDs 63 are concentrated on one inspection status board provided in the circuit block 60, wire connection for circuit configuration is simple and space for wiring is not required. However, it takes some time for a worker to identify the CAID of the channel corresponding to the identification LED that is turned on due to poor assembly on the inspection status board. If the number of CAIDs simultaneously inspecting the TPA connectors is large, this identification delay time will also become longer, and if a worker is unskilled, the identification delay time will be relatively longer. This could have a negative impact on the manufacturing cost of wiring harness parts.

Figure 8:
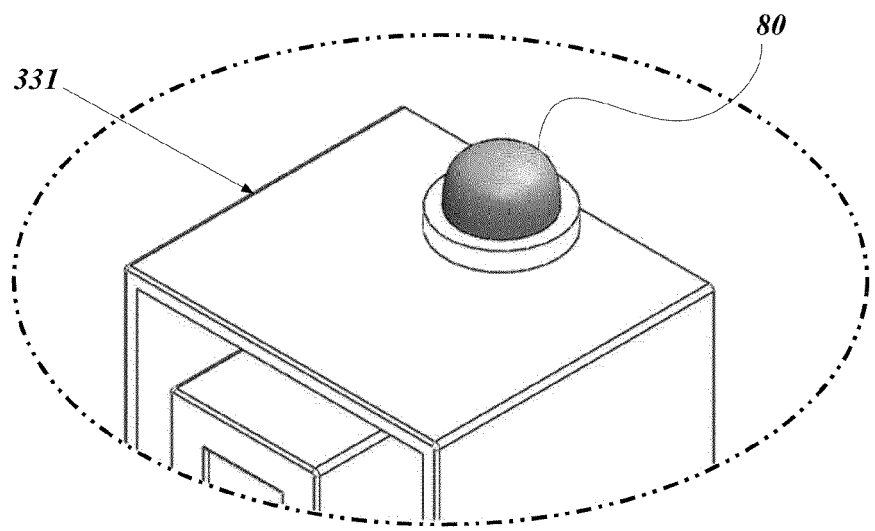
FIG. 8 is an example in which an LED that enables visual identification of an inspection device confirming an incompletely-assembled connector is provided on a part of inspection device, according to an embodiment of the present invention.

Therefore, in one embodiment according to the present invention, the MIS is configured in such a way that the identification LEDs 63 described above are distributively mounted on the individual CAIDs 80 as illustrated in FIG. 8 and are connected respectively to the circuit block 60 through cables. Such distributed arrangement of the identification LEDs allows a worker to immediately identify which channel's CAID has detected a poorly-assembled TPA connector.

Preferably, the identification LED 80 is provided on a component installed at the highest position. For example, the identification LED 80 is mounted on the upper side of the moving block 331 in the case of s CAID configured as in FIGS. 3A and 3B. This is because it is possible to minimize the possibility that the view of a worker is obstructed by other workers or loads at the inspection site.

The SLS made as illustrated in FIG. 7 due to the incompletely-assembled connector 33' is released as the carrier 330 returns to its original position when a worker closes the main valve of the main pipe. In this release process, the compressed springs 342 push the matching box 340 to return to its original position within the moving block 331.

In the SLS illustrated in FIG. 7, the pressure by a pressurized air supplied from the air compressor is finally applied to the TF 33a of the poorly-assembled connector 33'. The longer this pressure is applied, the more likely it is to damage or break the TPA connector. In addition, since the reaction force also affects the driving mechanism to operate the moving block 331 by means of the square edge of the matching box 340 in close contact with the TF, fatigue of the driving mechanism accumulates in proportion to the duration of the SLS caused from an incompletely-assembled TPA connector.

Therefore, in one embodiment according to the present invention, If it is confirmed, by the CAID of each channel, that the fastening of the TF to the TPA connector is defective, the carrier 330 of the CAID is immediately returned to the original pre-inspection position without waiting until a worker closes the main valve of the main pipe. In this embodiment, an electrically-controllable solenoid valve 410 is installed in the supply pipe of each CAID, as illustrated in FIG. 9, in order to relieve an air pressure applied to the pneumatic cylinder 326 of the CAID at a necessary time.

Figure 9:
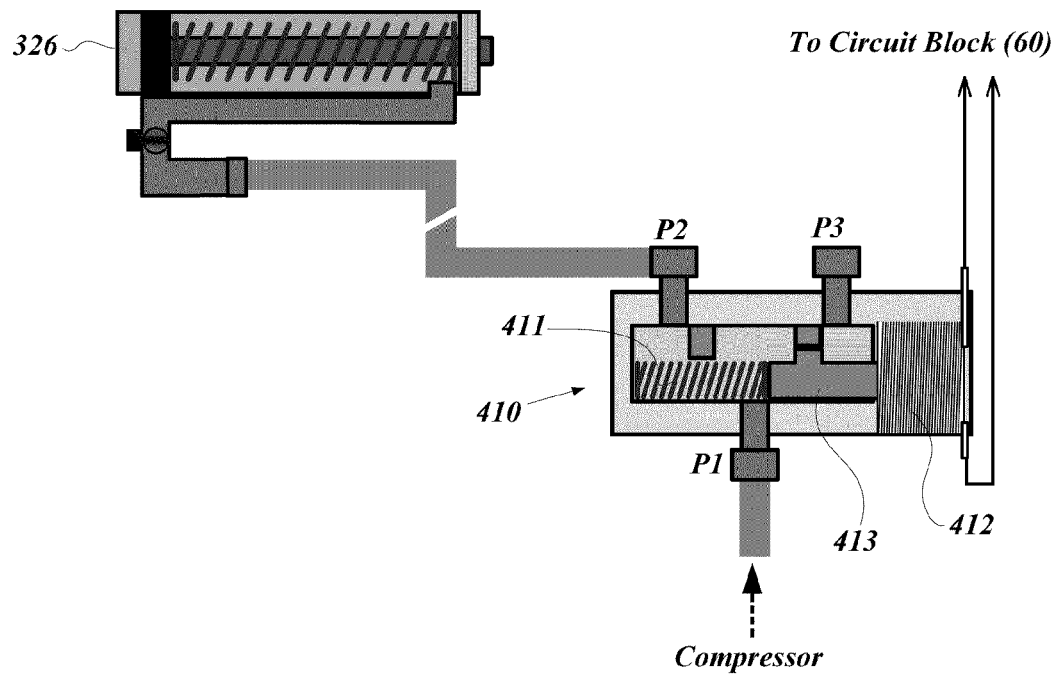
FIG. 9 is a view showing that a pressurized air supply pipe is connected to each inspection device through a solenoid valve for automatic connector removal in an inspection device confirming an incompletely-assembled connector, according to an embodiment of the present invention.

In the solenoid valve 410 illustrated in FIG. 9, when a removal signal is applied from the control unit 61 to the solenoid 412, the shaft 413 is operated. In the illustrated example, the shaft 413 is pushed out. Since the force of the solenoid 412 is greater than the reaction force of the spring 411 attached to the shaft 413, the shaft 413 moves within the cylinder to block the port P1 and open the port P3 at the same time. Therefore, since a pressurized air from the air compressor is cut off, and the supply pipe to the pneumatic cylinder 326 and the port P3 are connected, a pressurized air that has been applying pressure to the pneumatic cylinder 326 is discharged through the port P3 of the solenoid valve 410, and the air pressure is instantly relieved.

When an air pressure applied to the pneumatic cylinder 326 is relieved, the rod 325 advances by the restoring force of the elastic member in the pneumatic cylinder 326, and as described above, the moving block 331 is returned to the pre-inspection position. At this time, the LS/SLS is released and the seated TPA connector is momentarily pushed upward and removed.

Therefore, in the MIS configured by interposing the solenoid valve 410 in the pressurized-air pipe between the CAID of each channel and the main pipe from the compressor, when an electrical state change, as described above, due to physical contact between the bracket and the coupling tube is detected from the CAID of any channel, the control unit 61 of the circuit block 60 applies the removal signal to the solenoid valve installed in the supply pipe connected to the CAID of that channel, that is, it supplies a driving current required for that solenoid valve, so that the SLS made due to incomplete fastening of the TF is immediately released.

The moment the contact state between the bracket 343a and the coupling tube 333 is released by the complete exhaustion of the restoring force accumulated in the cushioning elastic member provided in at least one of them as the SLS is released, the control unit 61 stops applying the removal signal to the solenoid valve 410.

In this embodiment, the time for which the force by a pressurized air acts on the TPA connector and the driving mechanism of the CAID in the SLS is reduced by about the time it would take for a worker to place the TPA connectors to be inspected in all of the CAIDs, check the inspection results of all channels, and close the main valve of the main pipe to release the LS/SLS of CAIDs of all channels.

On the other hand, the solenoid valve 410 pushes the shaft 413 to its original position by the restoring force of the internal elastic member 411 when the removal signal from the control unit 61 is eliminated, so that the discharge port P3 is blocked, and the port P1 and the port P2 are connected again as shown, that is, the distribution pipe from the air compressor and the supply pipe to the pneumatic cylinder 326 are directly connected again. Accordingly, the corresponding CAID is in an inspection ready state in which the inspection operation can proceed as described above when a worker only places a TPA connector into the holder of that CAID while pressing the switch 323.

In the MIS of the embodiment in which the solenoid valve is installed in the supply pipe of pressurized air as illustrated in FIG. 9, if an CAID immediately returns to the inspection ready state by stopping applying the removal signal the moment the SLS is released as the bracket 343a of the rear side of the matching box and the coupling tube 333 of the moving block 331 are separated from each other, after the removal signal is applied to the solenoid valve 410 the moment the SLS is detected, that is, the bracket 343a and the coupling tube 333 come into contact with each other, a worker may try to re-position the automatically removed connector into the holder, thinking that the automatic removal of the seated connector is probably caused from the connector to be inspected not being exactly seated in the inspection position of the holder.

Such an erroneous operation of a worker is not only unnecessary action on the TPA connector automatically removed due to its defective assembly, but also advances again the carrier 330 being returning to the pre-inspection position to cause the TPA connector and the driving mechanism of the corresponding CAID to be impacted again. Because of this, the inspection time for all connectors become longer as well.

Therefore, in one embodiment according to the present invention, when the SLS of any one CAID needs to be released in accordance with the detection of the SLS of that CAID, that CAID is restored to the inspection ready state after a predetermined interval from the SLS detected time. For this predetermined interval, a suitable period of time, which is as short as possible above the time (for example, about 3 seconds) it takes for a worker to turn his/her attention to the next CAID after seating a TPA connector on one CAID, may be applied.

Figure 10A:
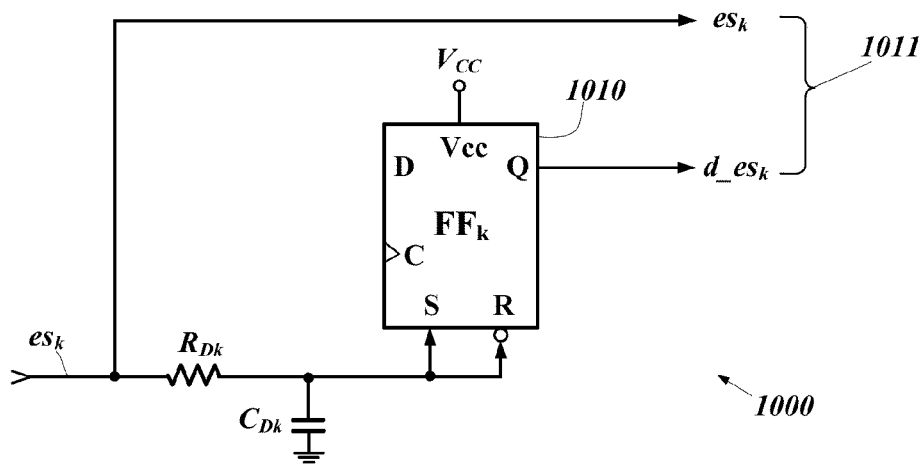
FIGS. 10A and 10B are examples of circuits configured to create a time delayed by a predetermined time after the point of automatic connector removal in an inspection device confirming an incompletely-assembled connector, according to embodiments of the present invention.
Figure 10A:
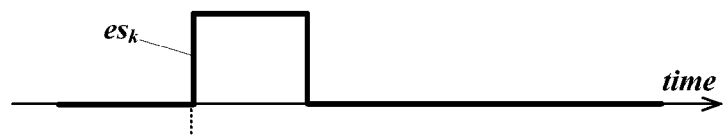

FIG. 10A illustrates a delay circuit for one channel that delays the locking signal $es_k$, to which the SLS is reflected, by a set delay time, in order to restore the inspection ready state after delaying a predetermined interval from the occurrence of the SLS. In the circuit block 60 of the MIS including a plurality of CAIDs, the delay circuit 1000 illustrated in FIG. 10A is provided for each locking signal $es_k$. Each delay circuit 1000 delays the locking signal $es_k$, and applies the delayed locking signal $d\_es_k$ together with the locking signal $es_k$ to an input terminal of the control unit 61, respectively.

The illustrated delay circuit 1000 includes a single flip-flop 1010, a resistor $R_{Dk}$ and a capacitor $C_{Dk}$ that are connected to the flip-flop. When the SLS is made in any one CAID, the corresponding locking signal $es_k$ becomes HIGH ($t_{dNG}$) to start charging the capacitor $C_{Dk}$, in the embodiment illustrated in FIGS. 4 and 6. The moment the charged voltage exceeds the threshold voltage of the set terminal (S), the output terminal (Q) is switched to HIGH ($t_{mRD}$).

Since the charging rate is determined by both the resistance ($=R_O+R_{Dk}$) and capacitance ($=C_{Dk}$) on the charging path of the current, the delay circuit 1000 is equipped with resistive and capacitive components having values such that the time $T_{reqD}$ from start of charging until the charging voltage reaches the threshold voltage are equal to the aforementioned predetermined interval.

In this embodiment, as soon as the locking signal applied to the input terminal becomes HIGH ($t_{dNG}$), the control unit 61 turns on the identification LED corresponding to the SLS-made CAID, and at the same time, applies the removal signal to the solenoid valve 410 connected to the supply pipe of that CAID, as described above, in order to immediately release the SLS made in that CAID. And, the control unit 61 sustains to apply the removal signal.

During this time $T_{reqD}$, the supply pipe to that CAID is connected to the discharge port P3 by the solenoid valve 410. Thus, even if a worker puts the automatically-removed TPA connector back into the holder of that CAID and presses the lower switch 323, the pneumatic cylinder 326 does not operate. That is, the carrier 330 returning to the inspection ready position does not advance in the inspection direction again.

Thereafter, when the predetermined interval $T_{reqD}$ elapses and the delayed locking signal $d\_es_k$ becomes HIGH ($t_{mRD}$), the control unit 61 stops applying the removal signal to the solenoid valve 410. When the removal signal is eliminated, the solenoid valve 410 installed in the supply pipe of the corresponding CAID connects the supply pipe to the distribution pipe of a pressurized air as explained above, so that the corresponding CAID is restored to the inspection ready state in which a TPA connector can be inspected again.

Figure 10B:
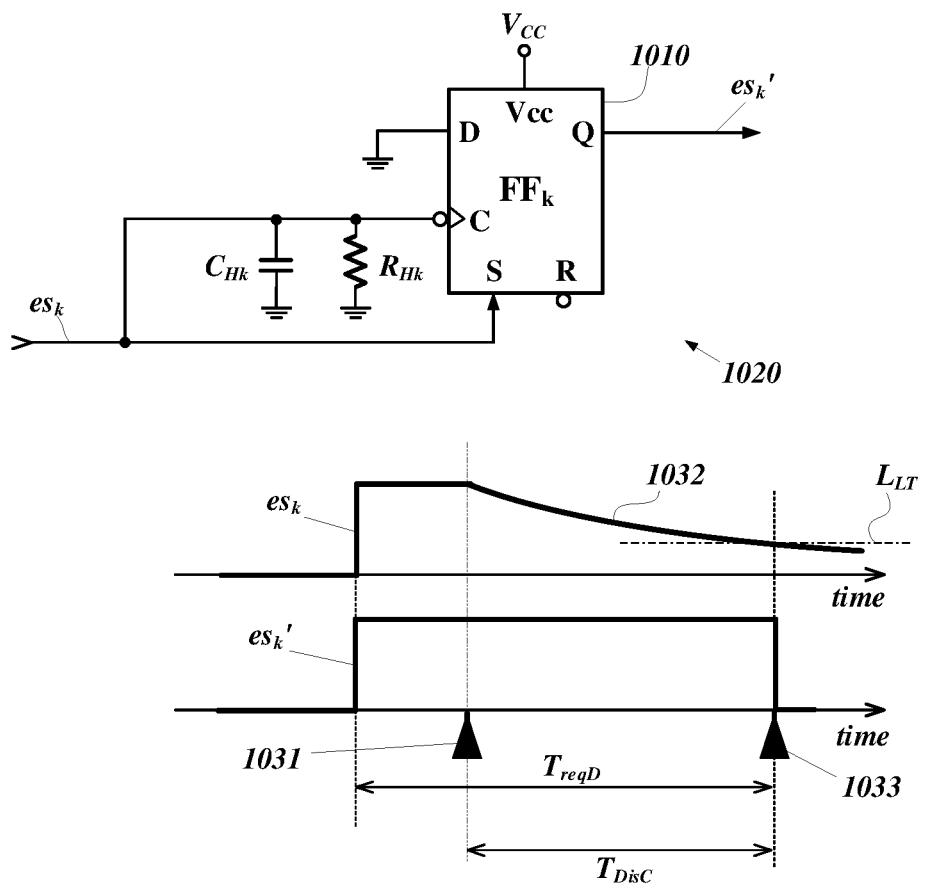

In the embodiment according to FIG. 10A, the delayed locking signal $d\_es_k$ is separately produced from the locking signal $es_k$, and the control unit 61 receives and uses, for automatic removal and restoration to the inspection ready state, both (1011) the original signal $es_k$ and the delayed signal $d\_es_k$ for the CAID of each channel. Alternatively, in another embodiment of the present invention, only a single signal may be used. FIG. 10B shows the circuit block 60 configured, according to the present embodiment, such that an off-holding circuit 1020 for delaying only the timing, at which the locking signal is released, by a necessary predetermined time is inserted into each locking signal line $es_k$.

In the illustrated off-holding circuit 1020, the moment the locking signal $es_k$ becomes HIGH due to the SLS, the output terminal (Q) of the flip-flop 1010 also immediately becomes HIGH, and the capacitor $C_{Hk}$ connected to the clock terminal of the flip-flop starts charging. According to the transition of the signal $es_k'$ of the output terminal (Q) to the HIGH state, the control unit 61 applies the removal signal to the solenoid valve 410, so that the carrier 330 starts to move back to the pre-inspection position. When the contact point between the bracket 343a and the coupling tube 333 is separated (1031), the capacitor $C_{Hk}$ starts discharging through the resistor $R_{Hk}$ (1032). During this discharge, the signal $es_k'$ of the output terminal (Q) maintains the set HIGH as it is. And, when the discharged voltage falls below the voltage level $L_{LT}$ demanded for LOW by the clock stage, the LOW being applied to the input terminal (D) at that moment is latched to the output terminal (Q), whereby the signal $es_k'$ applied to the input terminal of the control unit 61 is switched to LOW.

According to this holding operation for the locking signal $es_k$ of the off-holding circuit 1020, a specific time point 1033 delayed by a predetermined time $T_{DisC}$ after the time point 1031, at which the electrical contact is actually released, is determined.

Therefore, the control unit 61 can operate based on a single signal $es_k'$ provided by the off-holding circuit 1020. That is, when the signal $es_k'$ becomes HIGH, the control unit 61 conducts the removal operation (applying the removal signal to the solenoid valve and lighting the identification LED) for the corresponding CAID, and when the signal $es_k'$ becomes LOW again, it stops (1033) applying the removal signal to the solenoid valve in order to restore that CAID to the inspection ready state.

Since the off-holding time $T_{DisC}$ determined by the off-holding circuit 1020 depends on the resistance and the capacitance like the delay circuit illustrated in FIG. 10A, the off-holding circuit 1020 is configured to be equipped with a resistor and a capacitor having resistance and capacitance respectively that can obtain the delay time $T_{reqD}$ required for a connector-quality inspection site.

With respect to the resistor $R_{Hk}$ to be inserted into the discharge path of the off-holding circuit 1020, it is preferable that its resistance is sufficiently large compared to the resistor $R_O$ to be inserted to supply the current of the locking signal $es_k$. This is necessary to quickly charge the capacitor $C_{Hk}$ connected to the clock terminal of the off-holding circuit 1020 and to make the off-holding time Tasc relatively long.

The circuit configuration of FIGS. 10A and 10B described as being applied to the MIS to produce a necessary delay time until restoring a corresponding CAID to inspection ready state after releasing the SLS made during the inspection of the connector may be also implemented through other means. This other means may be a circuit configured differently from the circuit configuration illustrated in FIGS. 10A and 10B, or it may be a means that operates in a different manner. A pneumatic timer relay may be an example of the latter.

In the above description about the MIS made up of a plurality of CAIDs, an air compressor for supplying a pressurized air to provide the power required by the CAID of each channel has been mentioned. Since the supply and cut-off of a pressurized air from the compressor must be synchronized with the batch inspection of the TPA connectors, the timing is usually controlled through a pneumatic timer relay.

Therefore, if a harness manufacturing site is equipped with a pneumatic timer relay for the MIS to inspect TPA connectors or for the inspection or manufacturing of other parts, and if an available port is also on that relay, the same post-removal delay action described above can be achieved by using that available port to delay the locking signal $es_k$.

In the case of using a pneumatic timer relay, it is preferable to apply an off-delay timer that turns off its output after a set time has elapsed when its input is turned off, as described above, but an on-delay timer may be applied depending on the wiring method for the MIS.

A pneumatic timer relay can be applied to relatively strong electricity compared to the electronic circuit. Therefore, unlike the embodiment illustrated in FIGS. 10A and 10B, it may be applied to the removal signal to be applied by the control unit 61 to the solenoid valve 410, that is, to a wire carrying solenoid driving power, instead of being applied to the locking signal $es_k$.

More specifically, a wire for carrying the removal signal applied by the control unit 61 to the solenoid valve 410, which is allocated to the CAID of each channel, is connected to an input terminal of the off-delay timer, and an output terminal of that timer is connected to the opening/closing signal input terminal of the solenoid valve 410. In the MIS wired as described before, when an SLS is detected in any one CAID, the control unit 61 immediately applies the removal signal to the solenoid valve 410 of the corresponding channel and then stops applying it.

Since the off-delay timer of the corresponding channel installed in the middle of a path for carrying the removal signal outputs an ON-input immediately and outputs an OFF-input after a delay as much as the set time, even if the removal signal is eliminated immediately after being applied, the solenoid valve 410, to which the output of the off-delay timer is applied, connects the supply pipe of the corresponding CAID to the distribution pipe from the air compressor after the set delay time has elapsed.

If the shape or structure of the matching box 340 of each CAID is appropriately changed, the MIS of which embodiments have been described so far is, of course, applicable to the assembly inspection for a TPA connector of a non-illustrated form. Since the size as well as the coupling location of a TF to be fastened into a receptacle housing may vary depending on the type of TPA connector to which the TF is applied, the matching box of each CAID is preferably structured to be detachably coupled to the moving block.

Figure 11:
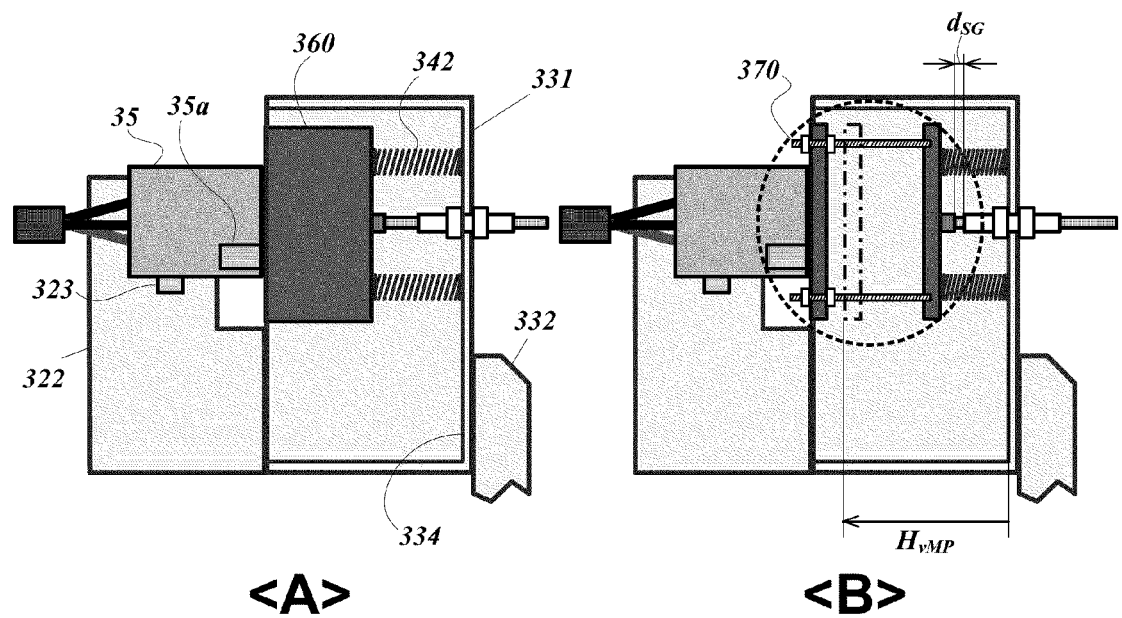
FIG. 11 shows examples of configurations for matching boxes of an inspection device, applicable to a receptacle housing to which a TF is coupled from the front instead of from the side, according to embodiments of the present invention.

FIG. 11 illustrates the LS of a CAID having a matching box applicable to a receptacle housing in which its TF is coupled from the front instead of the side. The <A> of FIG. 11 shows a part of the CAID of the embodiment in which the matching box 360 is a flat plate having a predetermined thickness. Considering the shape and/or structure of a TPA connector to be inspected, and the mating direction and dimension of its TF, the matching box 370 may be constructed with two or more multiple plates, as in the embodiment illustrated in <B> of FIG. 11, to match a required approach distance up to the connector jig at piston stroke of the pneumatic cylinder.

Figure 12:
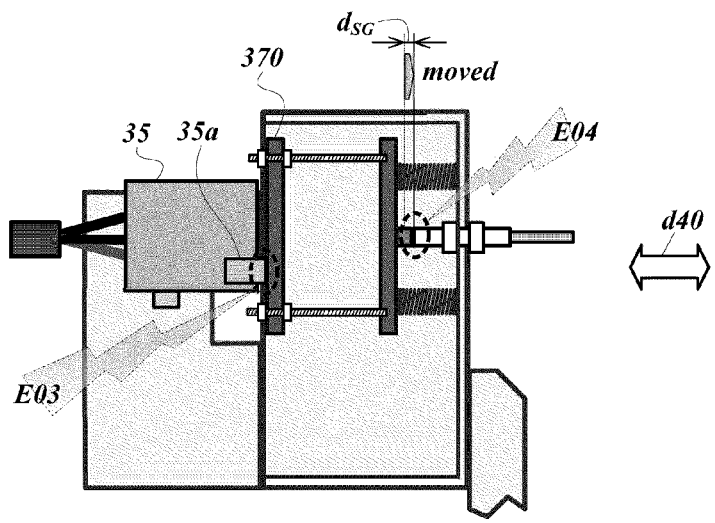
FIG. 12 is an illustration of an incomplete locking state made due to a defectively-assembled connector in case that the matching box is configured as illustrated in <B> of FIG. 11.

FIG. 12 illustrates the CAID that is in the SLS due to improper assembly of the TF 35a in case that a TPA connector to be inspected and the CAID are configured as illustrated in <B> of FIG. 11.

Assuming being seated in the holder of connector jig, like the TPA connector illustrated in FIGS. 11 and 12, in order to inspect whether the assembly of the TF 33a inserted and coupled to the receptacle housing in the same direction as the moving direction of the moving block of the CAID is defective or not, it is necessary that the aforementioned reference interval, that is, the distance $d_{SG}$ between the bracket on the rear side of the matching box and the coupling tube of the moving block is set relatively very narrow compared to the case of inspecting whether the assembly of the TF 35a inserted and coupled to the receptacle housing in the direction perpendicular to the moving direction of the moving block, as in the above-described embodiment, is defective or not.

In the inspection of the complete assembly of a TPA connector, since a TPA connector can be determined as defective without using an CAID if its TF protrudes to such an extent that a worker can immediately notice with the naked eye, the CAID configured according to the present invention is applied to find a TPA connector with poor assembly that protrudes to the extent that it is difficult to easily notice with the naked eye.

In the case of a TF that protrudes in a direction traverse to the direction in which the moving block moves when a TPA connector is seated on the connector jig, since even a slight protrusion prevents the movement of the moving block at the side of the front part of the receptacle housing, it is possible to set a large difference, which is used as the reference interval for the determination of assembly success and failure, in the amount of movement of the matching box relative to the moving block. The large difference in the amount of relative movement allows to obtain a sufficiently reliable assembly inspection result even if the mechanical precision of each CAID is low or there is a deviation in the seating position of a TPA connector.

However, in the case of the TPA connector 35 to be placed on the connector jig so that the direction in which the TF is coupled is the same as the moving direction of the matching box (d40), as illustrated in FIG. 12, if the reference interval is set to be wide, a TPA connector with poor assembly in which the TF protrudes shorter than the reference interval is not identified as incomplete for assembly.

Therefore, in the case of an CAID to conduct inspection as illustrated in FIG. 12, the reference interval should be set to be relatively short compared to the CAID of the above-described embodiment. FIG. 12 shows schematically an example determined to be incomplete for assembly in which the matching box 370 moves backward relative to the advancing moving block by a relatively very short reference width $d_{SG}$, after it is blocked (E03) by the TF 35a protruding from the inspection surface of the receptacle housing, so that the bracket and the coupling tube come into contact with each other (E04).

A TPA connector of its TF protruding from the receptacle housing less than the reference interval $d_{SG}$ is determined to be a complete assembly in the movement of the moving block by the piston stroke of the pneumatic cylinder. Therefore, it is necessary to set the reference interval $d_{SG}$ to the minimum height at which a TF can protrude from the surface of a receptacle housing when it is not fully fastened, and also to increase the precision of the mechanism and to minimize the deviation of seating positions caused in the manual work of seating a TPA connector on the connector jig.

In one embodiment according to the present invention, the TPA connector illustrated in FIGS. 11 and 12, in which its TF is fastened in the same direction as the coupling direction between the header and the receptacle housing, is seated in the holder with its side facing the matching box, differently from that illustrated in FIGS. 5A, 5B, etc. This connector seating method makes it possible to check the assembly suitability of the connector without being constrained by the strict requirements for the short reference interval described above and the mechanical precision etc. due to the short reference interval. In this specification, the inspection in which the side faces the matching box is referred to as 'Sideward-Faced Inspection' (SFI), and the inspection conducted with the front of the connector facing the matching box, as shown in FIGS. 5A and 5B, is referred to as a 'Forward-Faced Inspection' (FFI).

Figure 13A:
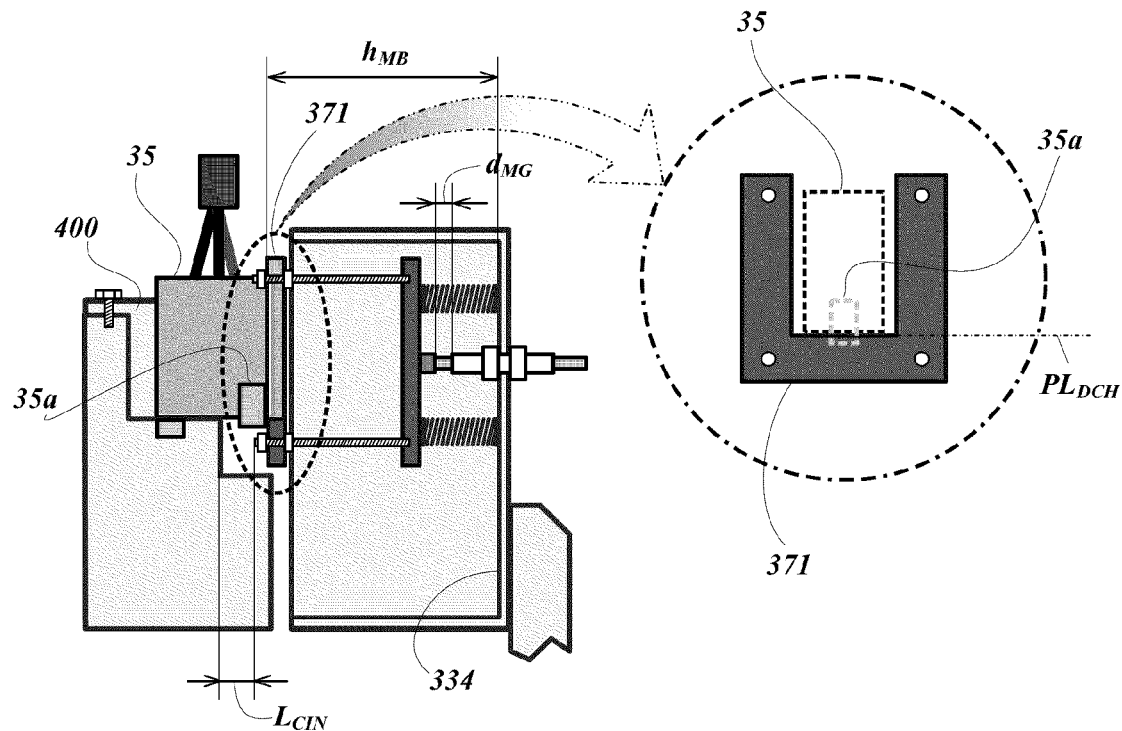
FIGS. 13A and 13B are diagrams showing an example of a matching box constructed in accordance with an embodiment of the present invention, and an inspection method that allows the illustrated matching box to approach the side of a connector by erecting the connector.
Figure 13B:
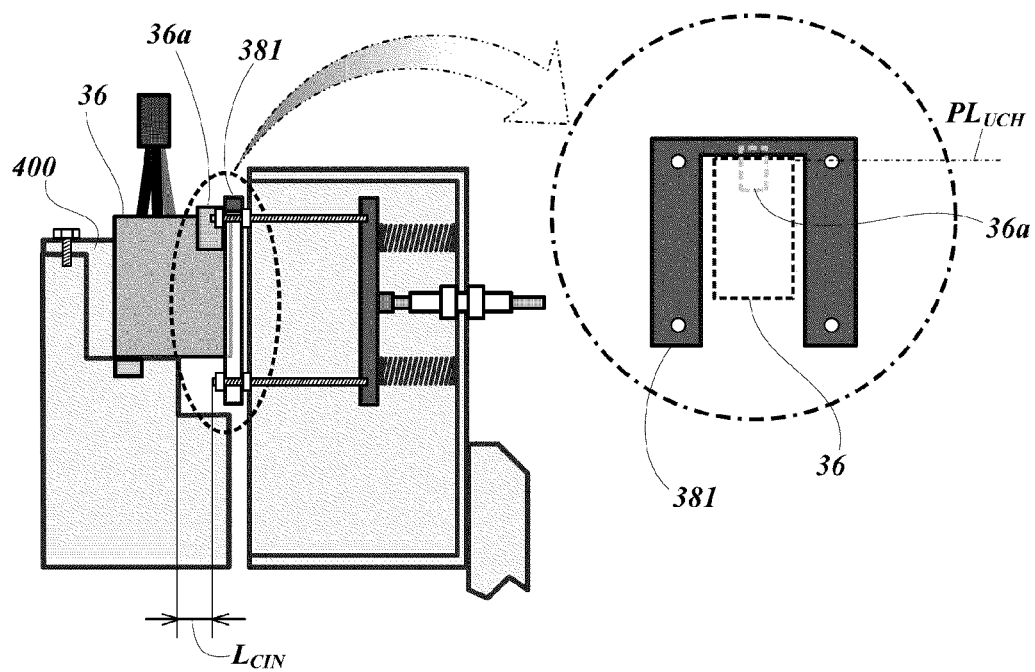

In the present embodiment for the SFI, the matching box is constructed in a form in which it has at least one plane that blocks the outside with reference to a virtual plane extended in the carrier movement direction from the surface, where the TF is fastened, of the TPA connector. FIGS. 13A and 13B show an example of the matching box constructed according to the present embodiment, and the SFI, to which an exemplary matching box is applied, with a TPA connector erected so that the matching box approaches its side.

FIG. 13A shows the SFI for a TPA connector into which its TF 35a is inserted and fastened from the front of the receptacle housing, and FIG. 13B shows the SFI for a TPA connector into which its TF 36a is inserted and fastened from the rear of the receptacle housing, respectively according to an embodiment of the present invention.

In the examples of FIGS. 13A and 13B, the matching box has a double plate structure so that the height $h_{MB}$ from the inner base surface 334 of the moving block can be freely adjusted. In the illustrated matching box, the front plates 371 and 381 pass through the side part of the seated connector with the inspection plane, i.e., the front/rear end surfaces $PL_{DCH}/PL_{UCH}$ of the connectors 35 and 36, as a boundary, and block outside of the boundary surface, that is, below (in case of the embodiment of FIG. 13A) or above (in case of the embodiment of FIG. 13B) the boundary surface.

Therefore, even for a poorly assembled TPA connector in which its TF 35a or 36a protrudes short from the front/rear end surface $PL_{DCH}/PL_{UCH}$, that protrusion can be detected by the front plate 371 of 381 of the exemplified form, In addition, in the case of a TPA connector in which its TF is normally assembled, a sufficient entry distance $L_{CIN}$ to the inside of the connector jig is secured. Thus, even in determining that the TF protruding short from the front/rear end surface $PL_{DCH}/PL_{UCH}$ is incomplete for assembly, the aforementioned reference interval $d_{MG}$ can be set relatively long enough compared to the case of applying the FFI illustrated in FIGS. 11 and 12, thereby enabling connector inspection that is not affected by mechanical precision or deviation of connector seating positions.

In case that a TPA connector to be inspected is more suitable for the SFI illustrated in FIGS. 13A and 13B than for the FFI, the seating position of the TPA connector to be inspected by the SFI can be adjusted if a plate-shaped position setter 400 is disposed at the rear of the holder. In the embodiment to which this position setter 400 is applied, a connector jig of which a holder is formed to be suitable for FFI with respect to other types of TPA connectors may be used in the SFI as it is. If the front length of a TPA connector is longer than the side length, the holder of the connector jig may be formed so that the seating position of a TPA connector can be adjusted by using the position setter when the FFI is applied.

Figure 14:
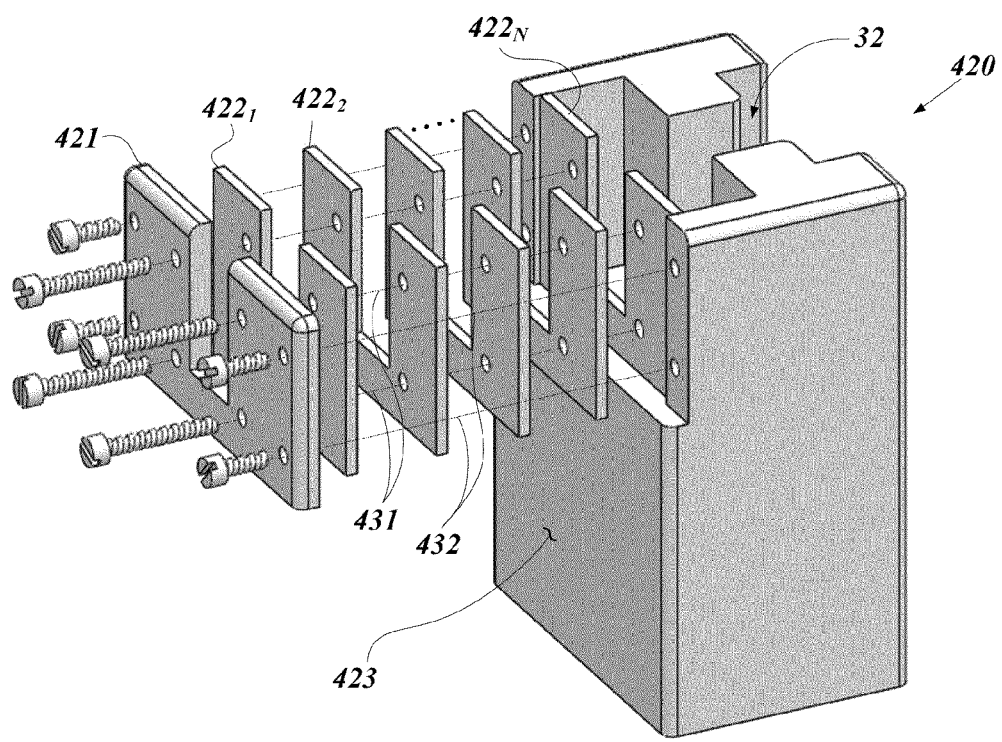
FIG. 14 is an example of a configuration for a connector jig capable of adjusting the connector-seating position depending on various dimensions of connectors to be inspected, according to another embodiment of the present invention.

Alternatively, the upper part of the connector jig forming the rear wall of the holder may be configured in a form in which thin-thickness packing plates 422$_i$, (i=1, 2, ..., N) are stacked, as illustrated in FIG. 14. Through the number of packing plates to be layered, it is possible to match the seating position in the holder to be suitable for various types of TPA connectors to be inspected.

The connector jig 420 structured in accordance with FIG. 14 is configured to further include a support plate 421 screwed and fixed to the upper rear wall of the connector jig in addition to the packing plate 422$_i$. After determining an area on which a TPA connector of the type to be inspected should be seated in the holder 32, a worker first combines (431) the number of packing plates of which the thickness corresponds to a distance from the rear surface 423 of the connector jig to the position that becomes the boundary of the determined area, and fixes (432) the support plate 421, to which the packing plates are coupled, to the upper rear wall of the connector jig 420 with screws.

On the other hand, in the above-described embodiments, it is premised that a worker maintains the state, in which a TPA connector is seated in the holder of the connector jig, for a short time of about 1 second until the carrier advances and becomes locked or semi-locked. This is because the power for moving the carrier is supplied by a pressurized air only while the switch 323 provided on the bottom surface of the holder is pressed.

In another embodiment according to the present invention, the CAID is configured so that a worker can seat another TPA connector on the CAID of another channel without the short time gap, which must be maintained in the above-described embodiments, immediately after seating a TPA connector in the holder of the CAID of one channel. The CAID configured in this embodiment can further improve workability by the MIS.

Figure 15:
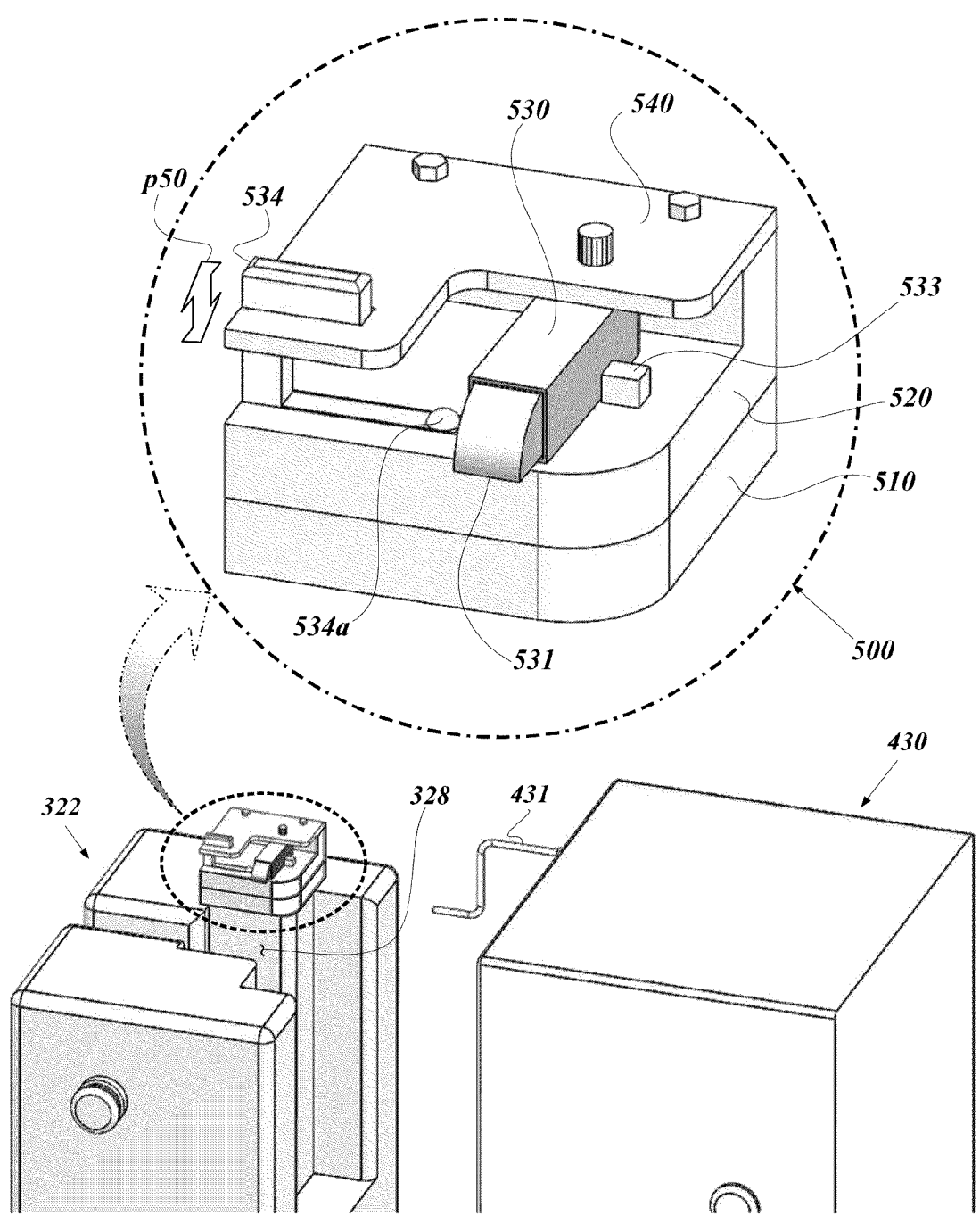
FIG. 15 is a view showing the configuration of an inspection device capable of fixing/releasing a connector to be inspected to/from a seating position, focusing on a part related to fixing/releasing a connector, according to another embodiment of the present invention.

FIG. 15 shows only the components different from the above-described embodiments for the CAID according to the present embodiment. The CAID is configured to include a Pivotable Connector Lock (PCL) 500 coupled to the upper surface next to the holder entrance of the connector jig 322, according to this embodiment.

The PCL 500 comprises, as shown, a lower base 510 and an upper base 520 stacked thereon; a latch bolt 531 having an inclined end; a latch guide 530, mounted on the upper base 520, for a housing function for accommodating the latch bolt 531 and a function for guiding the movement in and out of the latch bolt 531; a top cover 540 coupled to an upper end of one wall of the upper base 520; and a lock/unlock button 534 installed so as to be movable up and down in both grooves that are formed parallel to each other in the upper base 520 and the upper cover 540

The latch guide 530 has, therein, an elastic member such as a spring at the rear of the latch bolt 531. Thus, when the inclined surface of the latch bolt 531 is pressed vertically, the latch bolt 531 enters the housing, and when the force is released, it comes out by the elastic force accumulated in the elastic member.

An elastic member is also provided, in the upper base 520, at the bottom of the lock/unlock button 534. This elastic member is compressed when the lock/unlock button 534 is pressed downward from the top, and when the pressing force is released, it pushes up the lock/unlock button 534 again by its compressed elastic force.

Figure 16:
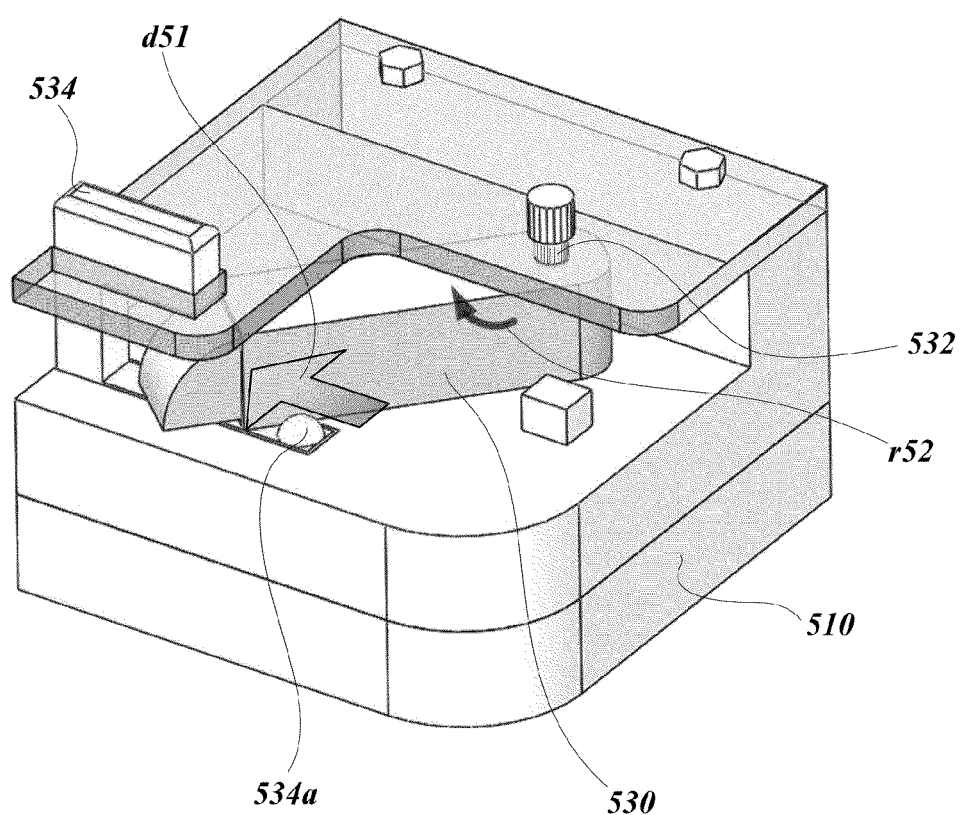
FIG. 16 is a perspective view showing a state of a rotating connector-lock of FIG. 15 in operation by making its top cover transparent.

Since the latch guide 530 has a vertical through-hole formed at the opposite end of the latch bolt 531, and a rotation shaft 532 is inserted into the through hole in such a way that it can rotate together with the latch guide 530, as illustrated in FIG. 16, the latch guide 530 rotates toward the lock/unlock button 534 along with the rotation shaft 532 about the rotation shaft 532 when a force is applied to its side. The lower base 510 has a built-in, for example, a spiral spring that is connected to the rotation shaft 532 and accumulates elastic force by the rotation of the shaft 532. This built-in spiral spring applies a force in the opposite direction of rotation to the rotation shaft 532 as it accumulates the rotational elastic force while the rotation shaft 532 rotates.

The PCL 500 is coupled and mounted to the connector jig 322 in such a way that the side surfaces of the upper base 520 and the lower base 510 are vertically coplanar with the second tread 328, to which a TPA connector inserted into the holder of the connector jig 322 is in close contact, that is, they are on the same plane as the inner side wall of the holder. In the state where PCL 500 is coupled onto the connector jig 322, only the latch bolt 531 protrudes toward the holder on the vertical plane.

The operation during the connector inspection of the CAID in which the PCL 500, constructed as illustrated in FIGS. 15 and 16, is coupled onto the upper part of the connector jig will be described.

A worker inserts a TPA connector to be inspected into the holder from the top of the connector jig in the same manner as in the above-described embodiments. At this time, as the TPA connector to be inspected presses the inclined surface of the latch bolt 531, the latch bolt 531 enters the latch guide 530. When the TPA connector is completely seated on the inspection position while pressing the switch 323 on the bottom of the holder, the height of the TPA connector is fitted to the bottom of the latch guide 530. At this time, because one side of the TPA connector blocking the latch bolt 531 has been removed, the latch bolt 531 protrudes back toward the holder by the elastic force, so that the bottom of the latch bolt 531 blocks the upper side of the seated TPA connector. Due to this blocking, the seated TPA connector is fixed in its position despite the reaction force of the switch 323 on the bottom.

As soon as the TPA connector to be inspected is fixed in this way, a worker can do the same for another CAID of the next channel.

Since the TPA connector caught and fixed by the latch bolt 531 is in a state of pressing the switch 323 on the bottom of the holder, a moving block 430 moves in the inspecting direction by the power of a pressurized air.

A front pole 431 is installed on the top (or side) of the front edge of the moving block 430 configured according to the present embodiment. The front pole 431 is bent, as shown, or in another way, so that its tip faces the side of the latch guide 530 when the moving block 430 advances.

The tip of the front pole 431 comes into contact with the side of the latch guide 530 just before the TPA connector seated in the holder starts to enter the matching box in the moving block 430. From this time, the front pole 431 starts to rotate the latch guide 530 (r52) about the rotation shaft 532 by pushing the side of the latch guide 530 (d51).

The latch guide 530 rotates only horizontally without vertical movement within a width limited by the lower base 510 and the upper cover 540.

During this rotation, the latch guide 530 passes the lock/unlock button 534 while pressing a locking protrusion 534a thereof for a while. When the side to which the force is applied completely passes the locking protrusion 534a, the lock/unlock button 534 that was briefly pressed rises by the elastic force, so that the locking protrusion 534a blocks the return of the rotated latch guide 530 to its original position.

Because the rotated latch guide 530 has been caught by the locking protrusion 534a, the state in which the latch bolt 531 blocking the top of the seated TPA connector is removed is maintained even if the front pole 431 is moved back. If the SLS occurs due to an incompletely-assembled connector, that TPA connector can be automatically removed by controlling the solenoid valve 410 of the control unit 61, as in the above-described embodiment, since the holder entrance is completely open.

When inspecting another TPA connector, a worker releases the state, in which the latch guide 530 has been caught by the locking protrusion 534a, by pressing the lock/unlock button 534. Accordingly, the rotational elastic force accumulated in the spiral spring built in the lower base 510 reversely rotates the rotation shaft 532 to return the latch guide 530 to its original position where its side is in close contact with a stopper 533. In this state, a worker inserts and seats another TPA connector to be inspected next in the holder while pushing the inclined surface of the latch bolt 531 with that TPA connector, as described before. Subsequent processes are conducted in the same manner as explained above.

Leaving the latch bolt 531 release state as shown in FIG. 16, a worker may seat a TPA connector to be inspected in the holder. Next, a worker presses the lock/unlock button 534 to return the latch guide 530 to its original position, thereby fixing the seated TPA connector in the holder.

Unless the various embodiments, for the device to inspect the assembly defect of a TPA connector, described so far are incompatible with each other, the explained embodiments can be properly chosen in various ways and then combined to embody the concept and idea of the present invention.

The embodiments of the present invention described above have been introduced for the purpose of illustration; therefore, it should be understood by those skilled in the art that modification, change, substitution, or addition to the embodiments is possible without departing from the technical principles and scope of the present invention defined by the appended claims.

What is claimed is:

1. A device for checking whether a connector is fully assembled, comprising:
   a connector jig configured to have a holder which is a space open toward at least one side and an assembled connector is seated in;
   a moving block configured to have an inner space open toward one side, and to be capable of moving in a first direction toward the holder and in a second direction opposite to the first direction;
   a matching box, mounted in the moving block to be moved together with the moving block and to be also movable in the first direction and the second direction in the moving block, of which shape is such that its movement in the first direction is blocked by a part of the connector seated in the holder if the part protrudes from an outer surface of the connector;
   a driving unit configured to drive the movement of the moving block in the first and second directions; and
   a contact switch configured to change its electrical state when the matching box moves, relative to the moving block, at a predetermined interval in the second direction,
   wherein the moving block is configured to move further in the first direction by at least the predetermined interval even in a state in which the movement of the matching box in the first direction is blocked.

2. The device of claim 1, wherein a switch protruding upward by an elastic force is provided on a bottom surface of the holder,
   the device is configured to supply power to the driving unit when the switch is pressed by a connector seated in the holder, and
   the driving unit moves the moving block in the first direction when power is supplied.

3. The device of claim 2, further comprising a control unit configured to move the moving block in the second direction by controlling an operation of the driving unit when the electrical state of the contact switch changes to a specific state.

4. The device of claim 3, wherein the controlling the operation of the driving unit is cutting off a power supplied to the driving unit, and
   wherein the control unit is configured to maintain, even if the electrical state of the contact switch is changed back to a state before the specific state, a state in which the supply of the power to the driving unit is cut off for a predetermined time from the point in time when the electrical state is changed back.

5. The device of claim 3, further comprising an off-delay unit configured to output a signal at a time delayed by a predetermined time from when the electrical state is changed back from the specific state to a state before the specific state.

6. The device of claim 3, wherein the control unit is further configured to turn on an LED light when the electrical state of the contact switch changes to the specific state, and
   wherein the LED light is mounted on the top of the moving block.

7. The device of claim 3, wherein the driving unit is a pneumatic cylinder operated by a pressurized air supplied as power, and
   wherein the controlling the operation of the driving unit is driving a solenoid valve, which is connected to a pipe for supplying the pressurized air to the pneumatic cylinder, to discharge the pressurized air in the pipe.

8. The device of claim 2, further comprising a connector lock, coupled to the side of the holder's entrance, that is equipped with a latch capable of fixing a connector to a seated position in the holder by partially blocking one side of the seated connector to prevent the seated connector from coming off the holder by the elastic force of the switch.

9. The device of claim 8, wherein the connector lock comprises:
   a rotatable latch member configured to accommodate the latch for hooking one end of the seated connector and to rotate together with a shaft when rotating about the shaft;
   an elastic member, connected to the shaft, configured to accumulate a rotational elastic force as the shaft rotates; and
   a button installed on a side, toward which the latch member rotates, to be movable in a direction perpendicular to a plane on which the latch member rotates,
   wherein a locking protrusion, formed on one surface of the button, is configured to block a portion of one side wall of the latch member when the latch member is rotated at a predetermined angle, thereby preventing the latch member from returning to a state before rotation due to the rotational elastic force of the elastic member.

10. The device of claim 8, wherein a pole, installed on a surface of the moving block facing the first direction, is configured to release a locking state of the seated connector made by the latch by pushing the latch at its tip end when the moving block moves in the first direction.

11. The device of claim 1, wherein the matching box is configured to include at least one surface that passes close, within a predetermined gap, to the specific surface of the connector seated in the holder as the moving block moves in the first direction.

12. The device of claim 11, wherein the matching box is configured such that a distance from the one surface to a surface to which one end of the contact switch is fixedly coupled is adjustable.

13. The device of claim 1, wherein the matching box includes a plate configured to have one surface disposed parallel to the specific surface of the connector seated in the holder, and
   wherein the plate, positioned at a front in the first direction in the matching box, approaches the specific surface as the moving block moves in the first direction.

14. The device of claim 13, wherein the matching box is configured such that a distance from the one surface to a surface to which one end of the contact switch is fixedly coupled is adjustable.

15. The device of claim 1, wherein the connector jig is configured to be able to adjust a position, based on the open one side, for seating a connector in the holder through attachment/detachment of at least one plate-shaped member.

16. The device of claim 1, further comprising an elastic member, capable of contracting or extending along a direction in which the moving block moves, that is inserted between a first surface, among inner surfaces of the moving block, perpendicular to the first direction, and a second surface of the matching box opposite to the first surface, and
- wherein one end of the contact switch is fixed to the first surface, the other end of the contact switch is fixed to the second surface, and at least one end of both ends of the switch protrudes from the surface to which it is fixed, and
- wherein the elastic member has a length such that when no force is applied to the matching box, the both ends are spaced apart by the predetermined interval or less.

17. The device of claim 1, further comprising a control unit configured to move the moving block in the second direction by controlling an operation of the driving unit when the electrical state of the contact switch changes to a specific state.

18. The apparatus for collectively inspecting each assembled state for a plurality of connectors, comprising:
- a plurality of devices of claim 1; and
- a control unit configured to move the moving block included in an arbitrary device in a direction away from the connector jig included in the arbitrary device by controlling an operation of the driving unit included in the arbitrary device when the electrical state of the contact switch included in the arbitrary device changes to a specific state.

* * * * *